(12) United States Patent
Jiao et al.

(10) Patent No.: US 11,640,934 B2
(45) Date of Patent: May 2, 2023

(54) LITHOGRAPHICALLY DEFINED VERTICAL INTERCONNECT ACCESS (VIA) IN DIELECTRIC POCKETS IN A PACKAGE SUBSTRATE

(71) Applicant: Intel Corporation, Santa Clara, CA (US)

(72) Inventors: Meizi Jiao, Chandler, AZ (US); Chong Zhang, Chandler, AZ (US); Hongxia Feng, Chandler, AZ (US); Kevin Mccarthy, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 987 days.

(21) Appl. No.: 15/941,903

(22) Filed: Mar. 30, 2018

(65) Prior Publication Data
US 2019/0304889 A1 Oct. 3, 2019

(51) Int. Cl.
*H01L 23/498* (2006.01)
*H01L 23/00* (2006.01)
(Continued)

(52) U.S. Cl.
CPC .... *H01L 23/49838* (2013.01); *H01L 21/4857* (2013.01); *H01L 23/49822* (2013.01); *H01L 23/562* (2013.01); *H05K 1/116* (2013.01); *H05K 3/061* (2013.01); *H05K 3/4007* (2013.01); *H05K 3/4038* (2013.01)

(58) Field of Classification Search
None
See application file for complete search history.

(56) References Cited

U.S. PATENT DOCUMENTS 5,266,446 A * 11/1993 Chang ................... H01L 21/481
438/692
5,557,502 A * 9/1996 Banerjee ........... H01L 23/49816
361/712

(Continued)

FOREIGN PATENT DOCUMENTS

CN 1484482 A * 3/2004 ......... H01L 21/6835
CN 101425483 A * 5/2009 ........... H01L 23/562
(Continued)

*Primary Examiner* — Timothy J. Dole
*Assistant Examiner* — Muhammed Azam
(74) *Attorney, Agent, or Firm* — Schwabe, Williamson & Wyatt P.C.

(57) ABSTRACT

Techniques for fabricating a package substrate comprising a via, a conductive line, and a pad are described. The package substrate can be included in a semiconductor package. For one technique, a package substrate includes: a pad in a dielectric layer; a via; and a conductive line. The via and the conductive line can be part of a structure. Alternatively, the conductive line can be adjacent to the via. The dielectric layer can include a pocket above the pad. One or more portions of the via may be formed in the pocket above the pad. Zero or more portions of the via can be formed on the dielectric layer outside the pocket. In some scenarios, no pad is above the via. The package substrate provides several advantages. One exemplary advantage is that the package substrate can assist with increasing an input/output density per millimeter per layer (IO/mm/layer) of the package substrate.

15 Claims, 11 Drawing Sheets

(51) Int. Cl.
*H05K 1/11* (2006.01)
*H01L 21/48* (2006.01)
*H05K 3/06* (2006.01)
*H05K 3/40* (2006.01)

(56) References Cited

U.S. PATENT DOCUMENTS

| | | | | |
|---|---|---|---|---|
| 6,436,735 B1* | 8/2002 | Goetz | ............... | H01L 22/20 257/701 |
| 6,476,506 B1* | 11/2002 | O'Connor | ............... | H01L 24/05 257/786 |
| 6,580,174 B2* | 6/2003 | McCormick | ............... | H05K 1/113 257/774 |
| 6,812,580 B1* | 11/2004 | Wenzel | ............... | H01L 23/50 257/691 |
| 6,897,164 B2* | 5/2005 | Baude | ............... | C23C 14/042 438/780 |
| 7,193,324 B2* | 3/2007 | Hsu | ............... | H01L 23/49822 257/773 |
| 7,728,421 B2* | 6/2010 | Tanoue | ............... | H01L 23/49827 257/692 |
| 7,825,005 B1* | 11/2010 | Chahal | ............... | H01L 25/18 438/455 |
| 7,838,982 B2* | 11/2010 | Nakamura | ............... | H01L 23/13 257/700 |
| 7,960,825 B2* | 6/2011 | Lin | ............... | H01L 24/48 257/692 |
| 8,754,518 B1* | 6/2014 | Carpenter | ............... | G06F 30/39 257/692 |
| 8,800,142 B2* | 8/2014 | Nang | ............... | B23K 3/0623 29/852 |
| 8,860,205 B2* | 10/2014 | Muthukumar | ............... | H01L 23/49822 257/701 |
| 9,024,431 B2* | 5/2015 | Liu | ............... | H01L 23/5329 257/692 |
| 9,620,404 B1* | 4/2017 | Brun | ............... | H01L 23/4985 |
| 9,704,796 B1* | 7/2017 | Gu | ............... | H01L 23/5389 |
| 9,820,391 B2* | 11/2017 | Shimizu | ............... | H01L 23/5383 |
| 9,837,347 B2* | 12/2017 | Hu | ............... | H01L 23/49866 |
| 9,853,006 B2* | 12/2017 | Arvin | ............... | H01L 24/16 |
| 10,249,561 B2* | 4/2019 | Ishihara | ............... | H01L 23/49894 |
| 10,334,728 B2* | 6/2019 | Ho | ............... | H05K 1/116 |
| 10,905,007 B1* | 1/2021 | Orlowski | ............... | H05K 3/243 |
| 10,991,647 B2* | 4/2021 | Oh | ............... | H01L 23/13 |
| 2003/0160325 A1* | 8/2003 | Yoneda | ............... | H01L 23/147 257/758 |
| 2004/0207067 A1* | 10/2004 | Ma | ............... | H01L 23/50 257/690 |
| 2005/0029649 A1* | 2/2005 | Kuzawinski | ............... | H01L 24/49 257/698 |
| 2006/0151863 A1* | 7/2006 | Das | ............... | H05K 1/162 257/E23.062 |
| 2006/0152911 A1* | 7/2006 | Humbert | ............... | H01L 23/50 361/783 |
| 2007/0000688 A1* | 1/2007 | Mobley | ............... | H01L 21/4857 29/846 |
| 2007/0125572 A1* | 6/2007 | Hsu | ............... | H05K 1/113 174/260 |
| 2007/0132082 A1* | 6/2007 | Tang | ............... | H01L 23/5389 257/686 |
| 2007/0246744 A1* | 10/2007 | Chen | ............... | H05K 3/4682 257/211 |
| 2008/0029894 A1* | 2/2008 | Wang | ............... | H01L 23/49822 257/E23.161 |
| 2008/0303132 A1* | 12/2008 | Mohammed | ............... | H01L 23/49838 438/106 |
| 2008/0315391 A1* | 12/2008 | Kohl | ............... | H01L 21/6835 257/690 |
| 2009/0189296 A1* | 7/2009 | Wu | ............... | H01L 23/49822 257/E23.141 |
| 2009/0242261 A1* | 10/2009 | Takenaka | ............... | H05K 3/465 174/262 |
| 2009/0250249 A1* | 10/2009 | Racz | ............... | H01L 23/13 29/829 |
| 2009/0321949 A1* | 12/2009 | Sim | ............... | H01L 25/50 257/777 |
| 2010/0108363 A1* | 5/2010 | Yang | ............... | H05K 1/116 174/254 |
| 2011/0005824 A1* | 1/2011 | An | ............... | H05K 3/4658 174/261 |
| 2011/0061922 A1* | 3/2011 | Lee | ............... | H01L 23/49827 29/846 |
| 2011/0156231 A1* | 6/2011 | Guzek | ............... | H01L 23/49822 257/686 |
| 2011/0193232 A1* | 8/2011 | Chen | ............... | H01L 23/3192 438/668 |
| 2011/0299259 A1* | 12/2011 | Hsieh | ............... | H05K 3/4007 174/267 |
| 2012/0112345 A1* | 5/2012 | Blackwell | ............... | H01L 23/49822 257/738 |
| 2012/0175153 A1* | 7/2012 | Kaneko | ............... | H05K 1/113 174/251 |
| 2013/0256876 A1* | 10/2013 | Lee | ............... | H01L 24/14 257/737 |
| 2014/0138816 A1* | 5/2014 | Lu | ............... | H01L 21/76898 257/737 |
| 2014/0361437 A1* | 12/2014 | Seo | ............... | H01L 23/13 257/773 |
| 2015/0048503 A1* | 2/2015 | Chiu | ............... | H01L 24/97 438/126 |
| 2015/0279776 A1* | 10/2015 | Hu | ............... | H01L 24/20 257/668 |
| 2015/0380340 A1* | 12/2015 | Cheng | ............... | H01L 21/6835 257/774 |
| 2016/0007467 A1* | 1/2016 | Lee | ............... | H01L 23/49811 29/841 |
| 2016/0020172 A1* | 1/2016 | Su | ............... | H01L 24/19 257/530 |
| 2016/0079219 A1* | 3/2016 | Hosomi | ............... | H01L 24/94 257/774 |
| 2016/0126220 A1* | 5/2016 | Chen | ............... | H01L 23/5226 257/737 |
| 2016/0155700 A1* | 6/2016 | Tzeng | ............... | H01L 23/147 257/532 |
| 2016/0172229 A1* | 6/2016 | Brun | ............... | H01L 21/6836 428/614 |
| 2016/0343646 A1* | 11/2016 | Alvarado | ............... | H01L 24/13 |
| 2017/0141055 A1* | 5/2017 | Liu | ............... | H01L 24/11 |
| 2017/0162516 A1* | 6/2017 | Joh | ............... | H01L 23/552 |
| 2017/0207196 A1* | 7/2017 | Lee | ............... | H01L 24/11 |
| 2017/0245365 A1* | 8/2017 | Ishihara | ............... | H05K 3/0061 |
| 2017/0263579 A1* | 9/2017 | Hu | ............... | H01L 24/02 |
| 2017/0309559 A1* | 10/2017 | Park | ............... | H01L 21/6835 |
| 2019/0013303 A1* | 1/2019 | Goh | ............... | H01L 23/562 |
| 2019/0198436 A1* | 6/2019 | Vadlamani | ............... | H01L 21/4857 |
| 2019/0267332 A1* | 8/2019 | Sikka | ............... | H01L 21/4846 |
| 2019/0287934 A1* | 9/2019 | Deng | ............... | H01L 21/4867 |
| 2019/0304889 A1* | 10/2019 | Jiao | ............... | H01L 23/49822 |
| 2019/0371621 A1* | 12/2019 | Darmawikarta | ............... | H01L 23/49827 |
| 2019/0371744 A1* | 12/2019 | Brown | ............... | H01F 17/0006 |
| 2020/0066543 A1* | 2/2020 | Jain | ............... | H01L 23/3121 |
| 2020/0091053 A1* | 3/2020 | Paital | ............... | H01F 27/28 |
| 2020/0168536 A1* | 5/2020 | Link | ............... | H01L 21/4857 |
| 2020/0274020 A1* | 8/2020 | Jiang | ............... | G01J 1/0233 |
| 2021/0202404 A1* | 7/2021 | Eid | ............... | H01L 25/105 |
| 2021/0391283 A1* | 12/2021 | Hsu | ............... | H01L 23/3128 |

FOREIGN PATENT DOCUMENTS

| | | | | | |
|---|---|---|---|---|---|
| CN | 103681588 A | * | 3/2014 | ......... | H01L 21/4857 |
| CN | 103748678 A | * | 4/2014 | ......... | H01L 25/0657 |
| CN | 105321913 A | * | 2/2016 | ......... | H01L 21/4803 |
| CN | 105374784 A | * | 3/2016 | ......... | H01L 23/5383 |
| CN | 106469700 A | * | 3/2017 | ......... | H01L 21/0273 |
| CN | 104051379 B | * | 9/2017 | ......... | H01L 23/12 |
| CN | 111199948 A | * | 5/2020 | ......... | H01L 21/4857 |
| CN | 111710664 A | * | 9/2020 | ......... | H01L 21/6835 |
| EP | 2068605 A1 | * | 6/2009 | ......... | H05K 3/4682 |
| EP | 3373331 A1 | * | 9/2018 | ......... | H01L 23/16 |

(56) References Cited

FOREIGN PATENT DOCUMENTS

| GB | 2462014 A | * | 1/2010 | ........ H01L 23/49811 |
|---|---|---|---|---|
| JP | 2005039271 A | * | 2/2005 | ........... H05K 1/0251 |
| JP | 2008251702 A | * | 10/2008 | ............ H05K 3/4682 |
| JP | 2009135162 A | * | 6/2009 | ....... H01L 23/49838 |
| JP | 2010287874 A | * | 12/2010 | ........ H01L 21/4857 |
| JP | 2011009686 A | * | 1/2011 | ............. H05K 13/00 |
| KR | 20110045222 A | * | 5/2011 | ............. H01L 24/73 |
| KR | 20150037801 A | * | 4/2015 | |
| KR | 20150137824 A | * | 12/2015 | ........... H01L 23/642 |
| KR | 20150137829 A | * | 12/2015 | ......... H01L 21/6835 |
| KR | 20210024870 A | * | 3/2021 | |
| KR | 102310979 B1 | * | 10/2021 | |
| WO | WO-9715076 A1 | * | 4/1997 | ........ H01L 23/49811 |
| WO | WO-0119148 A1 | * | 3/2001 | ........... H01L 25/162 |
| WO | WO-2005076677 A1 | * | 8/2005 | ............. H05K 1/114 |
| WO | WO-2007129545 A1 | * | 11/2007 | ......... H01L 21/4857 |
| WO | WO-2015183184 A1 | * | 12/2015 | ............. H01L 24/80 |
| WO | WO-2019066993 A1 | * | 4/2019 | ............. B33Y 80/00 |

\* cited by examiner

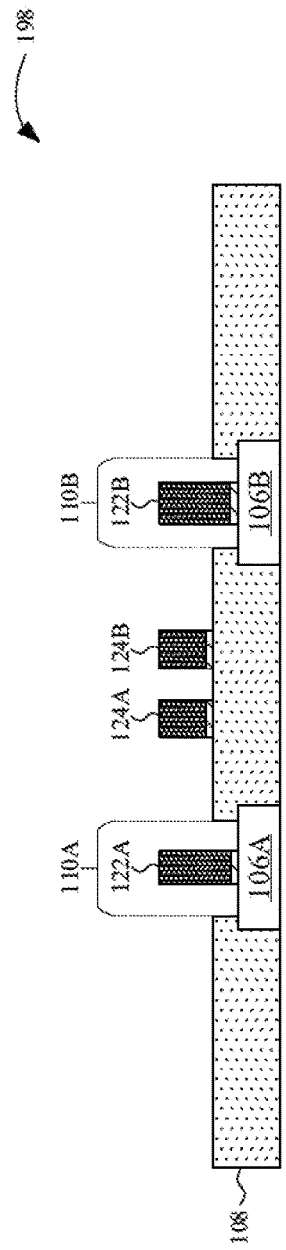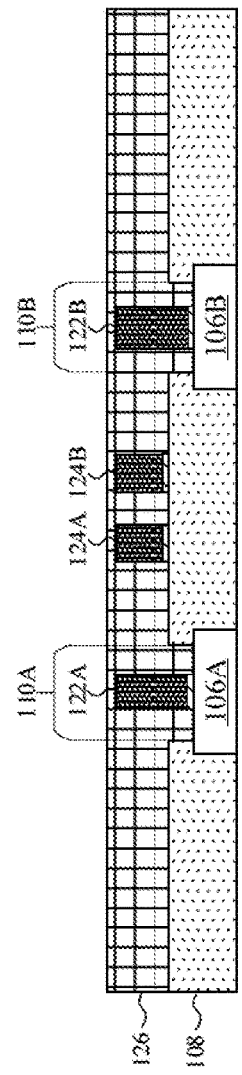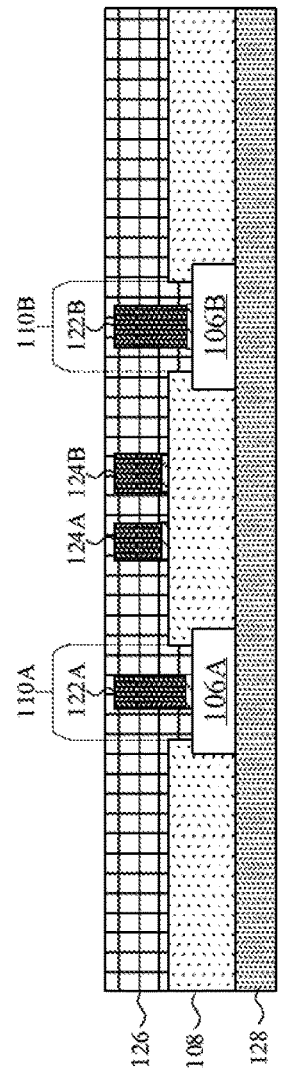

LITHOGRAPHICALLY DEFINED VERTICAL INTERCONNECT ACCESS (VIA) IN DIELECTRIC POCKETS IN A PACKAGE SUBSTRATE

BACKGROUND

Field

Embodiments described herein relate to package substrates. More specifically, embodiments described herein relate to vertical interconnect accesses (vias) formed in or on package substrates and semiconductor packages comprising such package substrates.

Background Information

A semiconductor package may comprise a package substrate and one or more semiconductor dies (which may also be referred to as integrated circuits (ICs) herein) on the package substrate. As demand for smaller electronic devices increases, semiconductor manufacturing and packaging technologies face pressures to optimize package substrates. Some of these pressures include, but are not limited to, increasing communication bandwidth, reducing thicknesses of package substrates (e.g., z-heights, etc.), and reducing the number of layers in package substrates. One or more solutions to these pressures can assist with increasing the achievable input/output (I/O or IO) density per millimeter per layer (IO/mm/layer) of package substrates, which can in turn assist with optimizing the package substrates. Such optimized package substrates can be included in a semiconductor package and/or an electronic device to assist with improving one or more characteristics of the semiconductor package and/or the electronic device. For example, an optimized package substrate in a semiconductor package can assist with reducing thicknesses (e.g., z-heights, etc.) of the semiconductor package. For another example, an optimized package substrate in an electronic device can assist with miniaturizing the electronic device.

In some scenarios, a package substrate comprises a plurality of metal layers, where at least two of the metal layers are separated by one or more dielectric layers. Vertical interconnect accesses (vias) are used to provide electrical connections between the metal layers. A via can sometimes be referred to as a conductive via. Typically, a via is formed on a pad deposited in or on a layer of package substrate using a laser drilling or an etching technique. The via and the pad may be formed from a metallic material or a combination of metallic materials.

One issue that may affect increasing the achievable IO/mm/layer of a package substrate is the minimum size of the pad. This is because the pad's minimum size on a layer typically needs to be greater than a size of the via in order to accommodate for misalignment that may occur during formation of the via. Another issue that may affect increasing the achievable IO/mm/layer of a package substrate is that each layer requires a pad and a via coupled the pad for signal propagation through a package substrate comprising multiple layers.

Several techniques exist for reducing misalignment between a via and pad on which the via is formed. One of these techniques, which is known as a self-aligned via (SAV) technique, includes using two separate lithography operations to pattern a layer of package substrate formed from resist or photoimageable dielectric (PID) materials by exposing the layer to light. In this technique, a conductive line is patterned using the first lithography operation and a via is patterned using the second lithography operation. Another technique, known as a zero misalignment via (ZMV) technique, includes patterning a layer of package substrate formed from resist or photoimageable dielectric (PID) materials by exposing the layer to light that passes through a gray scale mask. In this technique, the light that passes through the gray scale mask allows for different portions of the layer to be cured in differing amounts, which allows for patterning a conductive line and a via in a signal exposure operation.

The SAV and ZMV techniques described above have some drawbacks. One drawback is that both techniques require use of a planarization process to reveal formed vias. This planarization process can increase costs of semiconductor manufacturing and/or packaging. The SAV technique, in some scenarios, can require two semi-additive process (SAP) operations: a first SAP operation to plate metallic materials into a pattern to form a via; and a second SAP operation to plate metallic materials into a pattern to form a pad. Use of two separate SAP operations can increase costs of semiconductor manufacturing and/or packaging. The ZMV technique can, in some scenarios, eliminate misalignment between a via and a pad on which the via is formed. The ZMV technique, however, is not widely used and its margin of success may be low. Furthermore, the SAV and ZMV techniques may, in some scenarios, require each layer to include a pad and a via coupled the pad for signal propagation through a package substrate comprising multiple layers.

BRIEF DESCRIPTION OF THE DRAWINGS

Embodiments described herein are illustrated by way of example and not limitation in the figures of the accompanying drawings, in which like references indicate similar features. Furthermore, in the figures, some conventional details have been omitted so as not to obscure from the inventive concepts described herein.

DETAILED DESCRIPTION

Figure 1A:
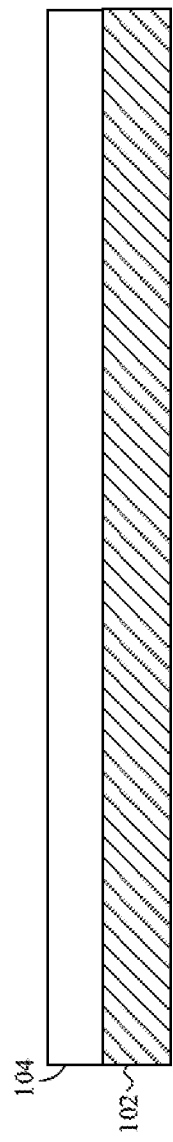
FIGS. 1A-1N are cross-sectional side view illustrations of a lithographically patterned via in a pocket (Litho-VIP) method of forming a package substrate, where the package substrate comprises vias, conductive lines, and pads, according to one or more embodiments.

Embodiments described herein provide techniques that can assist with fabricating a via in a package substrate. A semiconductor package can include the package substrate and one or more semiconductor dies on the package substrate. The semiconductor package and/or the package substrate can be coupled to a board (e.g., a printed circuit board, etc.). One or more embodiments described herein are directed to techniques for fabricating a package substrate comprising a via and a pad. The package substrate can be included in a semiconductor package. For one embodiment, a package substrate includes: a pad in a dielectric layer; a via; and a conductive line. The dielectric layer can include a pocket above the pad. One or more portions of the via may be formed in the pocket above the pad. Zero or more portions of the via can be formed on the dielectric layer outside the pocket. The via and the conductive line can be part of a structure. Alternatively, the conductive line can be adjacent to the via. Structures are defined in more detail below. A clearance area can also be provided in or around the pocket to assist with preventing the conductive line from being formed in or on the via and/or the pocket. In this way, shorts circuits can be prevented. The clearance area may include a minimum pitch between the via and the conductive line.

Several advantages are provided by the embodiments described herein. One advantage is that the embodiment(s) described herein can assist with reducing or eliminating misalignment between a via and pad on which the via is formed, which can in turn assist with reducing the size of the pad. Reducing the size of the pad can assist with increasing the achievable IO/mm/layer of a package substrate. Another advantage of the embodiments described herein is that one or more pitches between conductive lines, vias, pads, and/or structures formed in a package substrate can be reduced (when compared to a conventional package substrate that is not formed in accordance with embodiments described herein). This reduction in the pitch(es) can assist with increasing the achievable IO/mm/layer of a package substrate. Yet another advantage is that the embodiment(s) described herein can assist with providing flexibility towards the choice of materials used for fabricating a package substrate. For example, one or more embodiments described herein do not require each layer in a package substrate comprised of multiple layers to include a pad and a via coupled the pad for signal propagation through or within the package substrate. Removal of this requirement can assist with reducing the sizes and/or numbers of pads in package substrate, which can in turn assist with increasing the achievable IO/mm/layer of the package substrate. One more advantage is that no investment in specialized equipment or materials is required to perform one or more of the techniques described herein—that is, currently available equipment or materials known in the art of semiconductor manufacturing and/or packaging can be used to perform one or more of the techniques described herein.

As shown by the advantages described above, one or more drawbacks associated with the vias, conductive lines, and/or pads in package substrates may be minimized or eliminated, which can in turn reduce costs associated with semiconductor manufacturing and/or packaging, with increasing the achievable IO/mm/layer associated with semiconductor manufacturing and/or packaging, with enhancing one or more properties associated with semiconductor manufacturing and/or packaging (e.g., enhancing a package substrate's electrical performance, enhancing a semiconductor package's electrical performance, etc.), and with reducing a thickness (e.g., z-height, etc.) associated with semiconductor manufacturing and/or packaging (e.g., reducing a package substrate's z-height, reducing a z-height of a layer of a package substrate, reducing a semiconductor package's z-height, etc.).

As used herein, the phrase "dielectric layer" and its variations include, but are not limited to, a layer of package substrate comprising mostly dielectric materials (i.e., materials that act as electrical insulators). Examples of dielectric materials include, but are not limited to, one or more selected from a group consisting of: (i) an epoxy resin; (ii) a polyimide; (iii) an epoxy laminate material (e.g., FR4, G10, G11, FR4, FR5, FR6, etc.), (iv) any combination thereof. One specific example of a dielectric layer comprising an Ajinomoto Build-up Film (ABF). Two or more dielectric materials can be combined and used to form a dielectric layer. It is to be appreciated that dielectric layers may comprise other materials that are not dielectric materials.

As used herein, the phrase "metal layer" and its variations include, but are not limited to, a layer of package substrate that is mostly comprised of a metallic material or a combination of metallic materials. Examples include, but are not limited to, copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Ag), platinum (Pt), any other suitable metallic material known in the art, or any combination thereof. For one embodiment, conductive layers include a metal alloy or a compound that includes Cu, Ru, Ni, Co, Cr, Fe, Mn, Ti, Al, Hf, Ta, W, V, Mo, Pd, Au, Ag), Pt, any other suitable metallic material known in the art, or any combination thereof. A metal layer may comprise one or more other materials that are not metallic materials.

As used herein, a "routing layer" and its variations include, but are not limited to, one or more layers of a package substrate on or in which conductive lines are formed. For example, a routing layer may comprise one or more of layers of a package substrate formed from at least one conductive pattern, and configured to enable coupling of two or more features on or in the package substrate. Examples of coupling include, but are not limited to, electrical coupling, magnetic coupling, optical coupling, or a combination thereof. For one embodiment, a routing layer comprises one or more selected from a group consisting of: (i) one or more metal layers; and (ii) one or more dielectric layers. For one embodiment, the routing layer comprises one or more metallic layers, where each of the one or more metallic layers is sandwiched between two or more dielectric layers and where at least one of the one or more dielectric and/or metal layers has one or more conductive lines formed therein or thereon. For one embodiment, the routing layer comprises one or more dielectric layers, where at least one of the one or more dielectric layers has one or more conductive lines formed therein or thereon.

As used herein, a "conductive line", a "trace", and their variations include, but are not limited to, one or more electrical pathways formed in or on one or more layers of a package substrate. Conductive lines may be formed from a metallic material or a combination of metallic materials. Conductive lines may comprise one or more other materials that are not metallic materials. Examples of conductive lines include, but are not limited to, microstrip conductive lines and stripline conductive lines. Examples of microstrip conductive lines include, but are not limited to, regular microstrip conductive lines, edge-coupled microstrip conductive lines, and embedded microstrip conductive lines. Regular microstrip conductive lines are conductive lines that are routed on an external layer of a routing layer. Forming these types of microstrip conductive lines requires designing of a thickness and a width of a conductive line, a height of the package substrate, and a type of dielectric material used to form one or more layers of the routing layer. Edge-coupled microstrip conductive lines enable routing differential pairs. Forming these types of microstrip conductive lines includes the same requirements as those used to form regular microstrip conductive lines with an additional requirement to design a conductive line spacing for a differential pair. Embedded microstrip conductive lines are also similar to regular microstrip conductive lines except that there is another dielectric layer above the microstrip conductive lines. Stripline conductive lines are surrounded by dielectric material suspended between two ground planes on internal layers of a routing layer. Examples of stripline conductive lines include, but are not limited to, symmetric or regular stripline conductive lines, asymmetric stripline conductive lines, edge-coupled stripline conductive lines, and broadside-coupled stripline. Symmetric or regular stripline conductive lines are routed on internal layers (between two ground planes) of a routing layer. Forming these types of stripline conductive lines requires designing of a thickness and a width of a conductive line, a height of the package substrate, and a type of dielectric material used to form one or more layers of the routing layer based on a constraint that requires the conductive lines to be embedded between the two ground planes. Forming these types of stripline conductive lines includes the same requirements as those used to form symmetric stripline conductive lines with an additional requirement to account for any stripline conductive lines that are not balanced precisely between the two ground planes. Edge-Coupled stripline conductive lines are for routing internal layer differential pairs. Forming these types of stripline conductive lines includes the same requirements as those used to form symmetric stripline conductive lines with an additional requirement to design a conductive line spacing for the differential pair. Broadside-Coupled stripline conductive lines are for routing internal layer differential pairs, but instead of side by side, the pairs are stacked on top of each other. Forming these types of stripline conductive lines includes the same requirements as those used to form edge-coupled stripline conductive lines.

For brevity, the phrase "the art", "the art of semiconductor manufacturing and/or packaging" and their variations as used herein comprise one or more selected from a group consisting of: (i) the art of semiconductor manufacturing; (ii) the art of semiconductor packaging; (iii) the field of semiconductor manufacturing; and (iv) the field of semiconductor packaging.

As used herein, the term "feature" refers to any part, element, or component known in the art that is attached to, adhered to, deposited on, applied to, formed in, and/or embedded in, a layer of a package substrate, a die, or a board (e.g., a printed circuit board). Examples of features include, but are not limited to, stiffeners, foils, heat spreaders, heat sinks, vias, pads, conductive lines (which may also referred to as traces herein), structures (as defined below), interconnects (e.g., wires, solder bumps, any other types of bumps, conductive pillars, etc.), and electronic components (e.g., inductors, capacitors, resistors, transistors, etc.). Some features include one or more other features (e.g., a structure as defined below, a structure comprising two or more other structures, a structure comprising at least one other structure and at least one of a pad, a via, or a conductive line, etc.).

As used herein, a "structure" and its variations refer to a plurality of features, where at least two features selected from the plurality of features are coupled (e.g., electrically coupled, mechanically coupled, chemically coupled, etc.) to each other. Examples of structures include, but are not limited to, a pad-via structure, a via-trace structure, and a pad-via-trace structure.

As used herein, a "pad-via structure" and its variations refer to a pad that is formed with a via on the pad, where the pad and the via are coupled (e.g., electrically coupled, mechanically coupled, chemically coupled, etc.) to each other.

As used herein, a "via-trace structure", a "via-conductive-line structure", and their variations refer to a via that is formed with a conductive line, where the via and the conductive line are coupled (e.g., electrically coupled, mechanically coupled, chemically coupled, etc.) to each other.

As used herein, a "pad-via-trace structure", a "pad-via-conductive-line structure", and their variations refer to a pad that is formed with a via on the pad, where the via and/or the pad is formed with a conductive line, where two or more of the pad, the via, and the conductive line are coupled (e.g., electrically coupled, mechanically coupled, chemically coupled, etc.) to each other.

As used herein, the terms "pitch", "spacing", "distance", and their variations refer to a nominal distance between specified locations of adjacent features on or in a layer of a package substrate, a die, or a board. The nominal distance may not match any real-world dimension, but within the domain of a layer of a package substrate, a die, or a board, the nominal size may correspond to a standardized dimension and/or tolerance. When a first feature is adjacent to a second feature, one or more third features may or may not be between the first and second features. One example of a specified location is a center location. For this example, a pitch may be referred to as a center-to-center spacing—that is, a straight line distance between centers of two adjacent features. Another example of a specified location is an edge. For this example, a pitch may be referred to as an edge-to-edge spacing—that is, a straight line distance between edges of two adjacent features.

As used herein, the term "edge", "border", and their variations refer to an outside limit of a feature on a layer of a package substrate, a die, or a board that is farthest away from a specified location. For a first example, an edge of a stiffener is farthest away from a center of the stiffener. For a second example, an edge of a stiffener is farthest away from a center of a package substrate.

As used here, the term "size" comprises, but is not limited to, one or more of the following: a width, a length, a radius, a diameter, a thickness (e.g., a z-height, etc.), any other suitable size, any combination of suitable sizes, and any combination thereof.

Figure 1B:
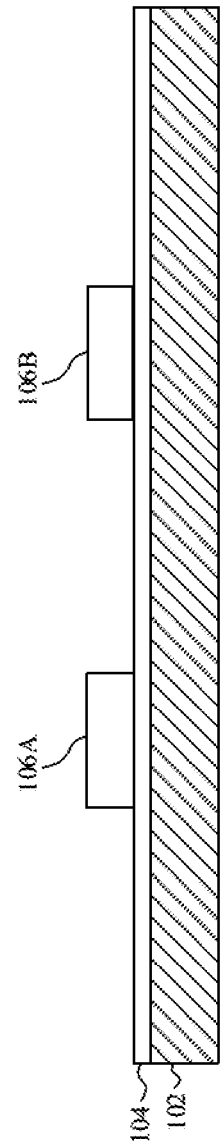
Figure 1C:
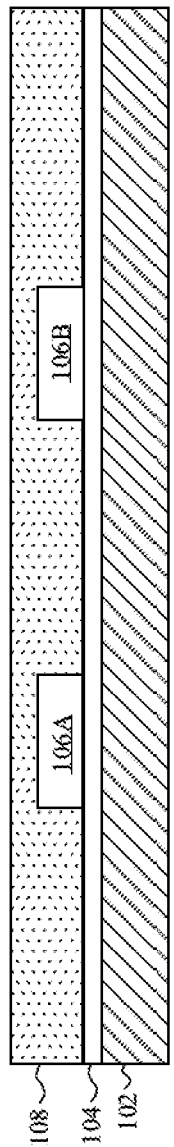
Figure 1D:
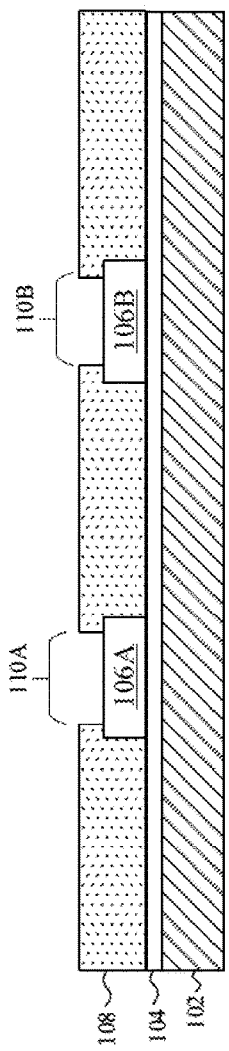
Figure 1E:
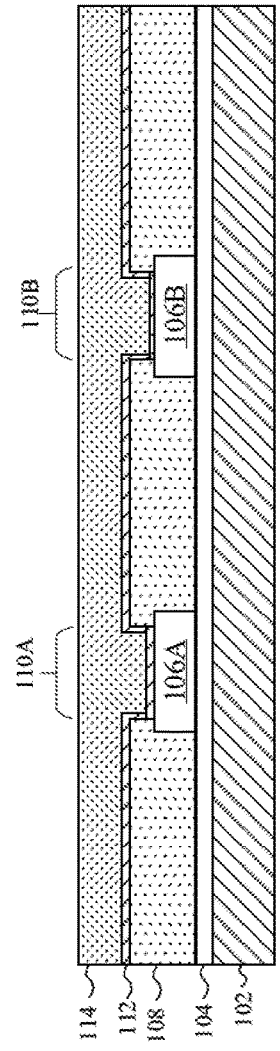
Figure 1F:
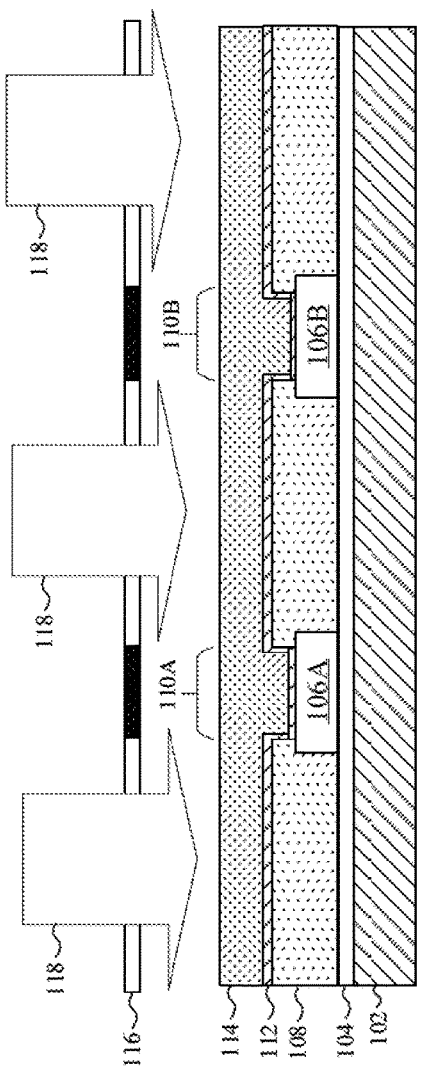
Figure 1G:
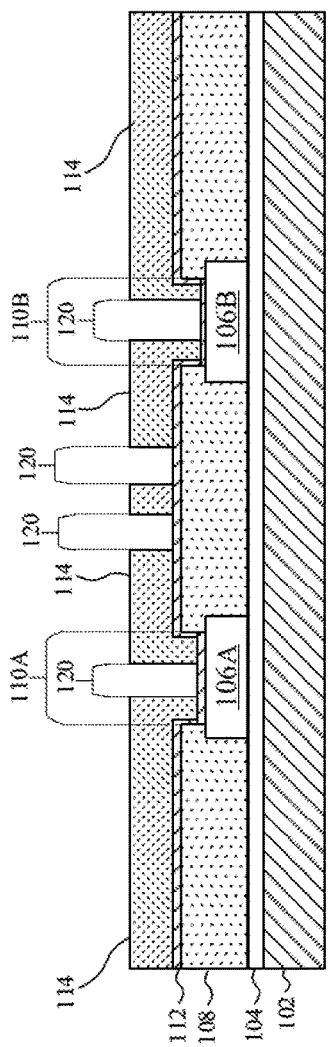
Figure 1H:
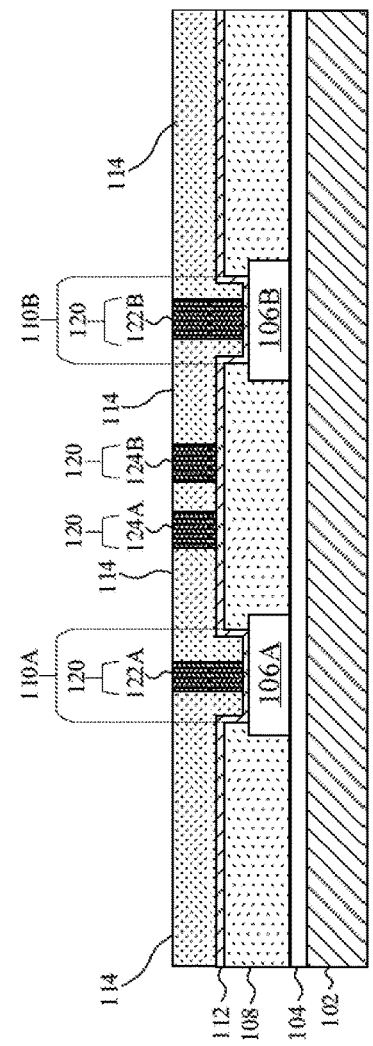
Figure 1I:
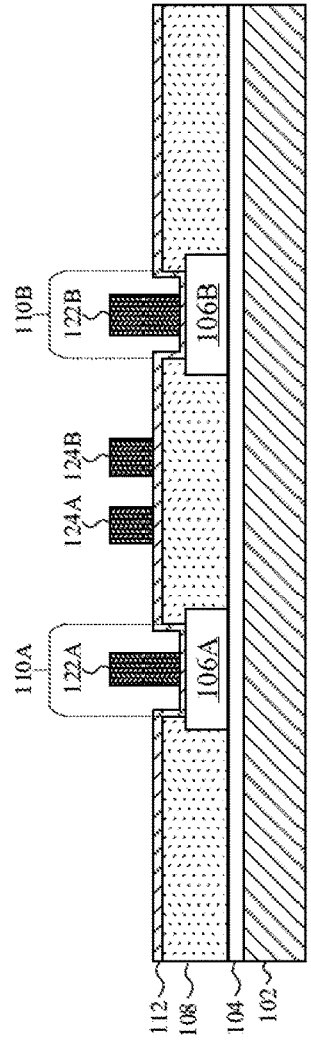
Figure 1M:
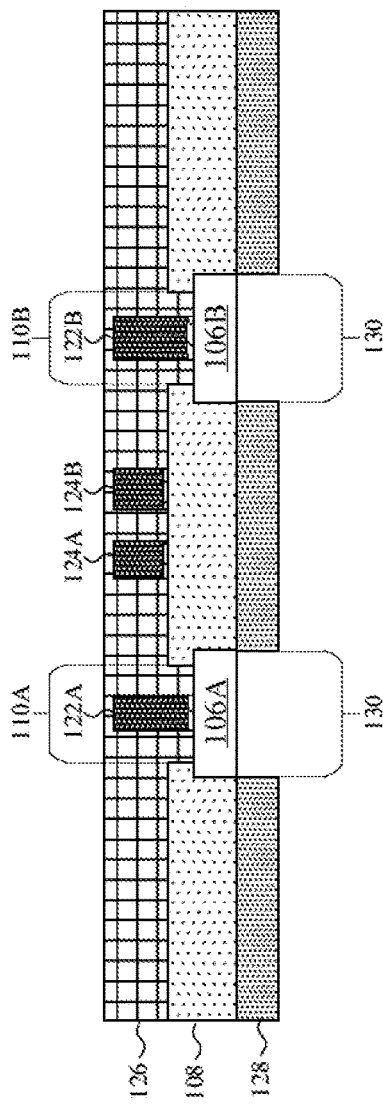
Figure 1N:
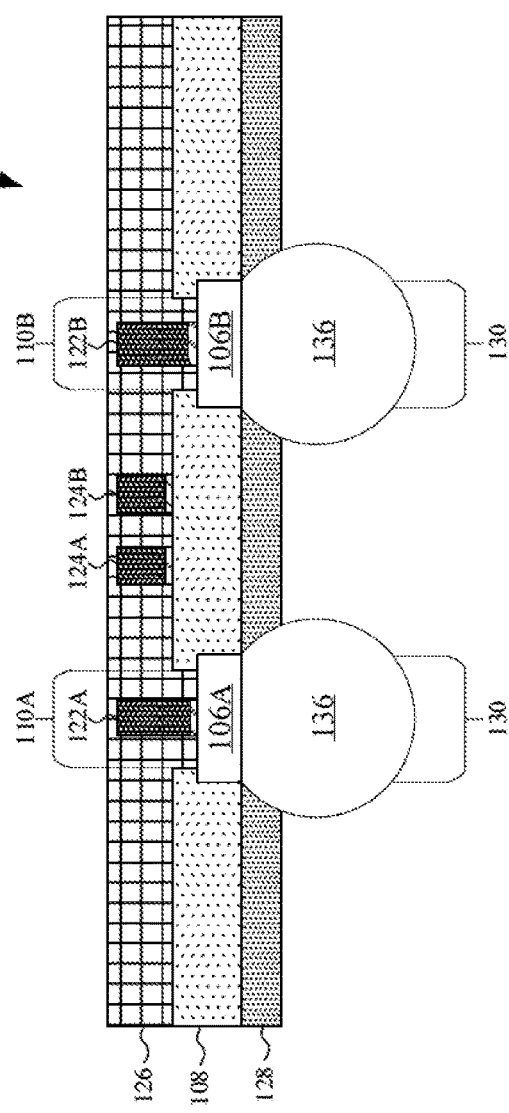

FIGS. 1A-1N are cross-sectional side view illustrations of a method of forming a package substrate 198, where the package substrate comprises vias 122A-B, conductive lines 124A-B, and pads 106A-B according to one or more embodiments. The package substrate 198 can be a coreless or a cored package substrate. For one embodiment, the package substrate 198 is a coreless package substrate. The package substrate 198 can be included in a semiconductor package (e.g., the semiconductor package 199 described below in connection with at least FIG. 1N, a cored semiconductor package, a coreless semiconductor package, any other type of semiconductor package, any combination thereof, etc.). The semiconductor package 199 may be a cored or coreless semiconductor package. For one embodiment, the semiconductor package 199 is a coreless semiconductor package. The method shown in FIGS. 1A-1N omits one or more processes, operations, and/or steps known in the art for simplicity and to avoid obscuring or convoluting one or more of the inventive concepts described herein. Furthermore, the method described below in connection with FIGS. 1A-1N may be referred as a "lithographically patterned via in a pocket" or "Litho-VIP" method.

With regard now to FIG. 1A, a blank panel 102 (which can also be referred to as a detach core 102) is provided. This blank panel 102 may be a peelable core, and may be constructed with a metallic material, a combination of metallic materials, one or more other suitable materials, or any combination thereof. For example, a blank panel 102 may include several layers of epoxy resin disposed between layers of Cu. A semi-additive process (SAP) may be used to process the blank panel 102 to create a metal layer 104. The SAP process flow can include pre-treating the blank panel 102. This pre-treatment can include one or more of: (i) a surface roughening process; and (ii) formation of a metal layer 104 on the blank panel 102. Surface roughening is known in the art and may include a process of abrading a top surface of the blank panel 102 (mechanically, chemically, or both) to improve the adhesion of the blank panel 102 with subsequently formed layers (e.g., metal layer(s) 104, dielectric layer(s), etc.). Surface roughening may be performed on a dielectric layer on the blank panel 102 (e.g., a layer or portion thereof formed using an epoxy dielectric material, etc.). Pre-treatment of the blank panel 102 may also include forming a metal layer 104 after surface roughening is performed. For example, the SAP process flow may include depositing a seed layer on a dielectric layer on the blank panel 102, depositing a resist layer on the seed layer, using a lithography process to create a patterned resist layer, selectively depositing metal in the patterned resist layer to form a metal layer 104, and subsequently removing any remaining portions of the resist, seed, and dielectric layers such that only the metal layer 104 remains on the blank panel 102. For an embodiment, the metal layer 104 may be formed by an electroplating process.

Moving on to FIG. 1B, for one or more embodiments, formation of the metal layer 104 includes processing the metal layer 104 to create pads 106A-B. A semi-additive process (SAP) may be used to process the metal layer 104 to create the pads 106A-B. At least one of the pads 106A-B may have a diameter that ranges from 25 micrometers (μm) to 35 μm.

Referring now to FIG. 1C, a dielectric layer 108 may be deposited, formed, or applied on or onto the uncovered surfaces of the metal layer 104 and the pads 106A-B. For example, the dielectric layer 108 may comprise an ABF. For this example, the dielectric layer 108 is laminated on or onto uncovered surfaces of the metal layer 104 and the pads 106A-B. As shown in FIG. 1C, the dielectric layer 108 encapsulates the pads 106A-B. As used herein, "encapsulating" does not require all surfaces to be encased within the dielectric layer 108. For some embodiments, the amount of the dielectric layer 108 is controlled to achieve a specified z-height. For one embodiment, the dielectric layer 108 may have a thickness (e.g., z-height, etc.) that ranges from 5 μm to 8 μm.

Moving on to FIG. 1D, pockets 110A-B are formed in the dielectric layer 108 above the pads 106A-B. For one embodiment, any suitable removal technique known in the art may be used to form the pockets 110A-B. Examples of a suitable removal technique include, but are not limited to, one or more laser drilling techniques, one or more laser ablation techniques, one or more etching techniques, any other suitable removal technique known in the art, or any combination thereof. For some embodiments, an amount of the dielectric layer 108 that is removed to form each of the pockets 110A-B is controlled to achieve a specified size of the pocket 110A-B (e.g., width and/or height as measured in the x and/or y directions, etc.). At least one of the pockets 110A-B may have a diameter that ranges from 15 μm 20 μm.

With regard now to FIG. 1E, for one embodiment, a seed layer 112 is deposited, applied, grown, or plated on top surfaces of the dielectric layer 108 and in the pockets 110A-B (e.g., on side surfaces of the layer 108 and top surfaces of the pads 106A-B in the pockets 110A-B, etc.). The seed layer 112 can be formed from a metallic material (e.g., Cu, Ti, etc.), any other suitable material, or any suitable combination of materials used to form seed layers as is known in the art. The seed layer 112 can be deposited via any suitable deposition technique, e.g., an electroless plating, sputtering, chemical vapor deposition (CVD), metalorganic chemical vapor deposition (MOCVD), atomic layer deposition (ALD), any other suitable technique of depositing, applying, growing, or plating seed layers, or a combination thereof.

With regard again to FIG. 1E, for one embodiment, a resist layer 114 is deposited on the seed layer 112. For an embodiment, the resist layer 114 is formed from one or more resist materials, one or more photoresist materials, or a combination thereof. The resist or photoresist material(s) may comprise any suitable dielectric material known in the art (e.g., a dielectric material suitable for processing by etching techniques, etc.). The resist or photoresist material(s) may be in film form, paste form, liquid form, or any combination thereof. The resist or photoresist material(s) may comprise a positive tone dielectric material, a negative tone dielectric material, or any combination thereof.

Moving on to FIG. 1F, for one embodiment, the resist layer 114 is patterned using one or more lithography techniques. For example, and as shown in FIG. 1F, a lithography technique can include exposing one or more portions of the resist layer 114 to light 118 (e.g., ultra-violet (UV), etc.) via a photomask 116. The lithography technique can be used to form one or more patterns in the resist layer 114. Any lithography technique or combination of lithography techniques known in the art can be used.

Referring now to FIG. 1G, the exposed resist layer 114 may be processed using a removal technique, which can include removing, stripping, or etching away the exposed portions of the resist layer 114 to reveal a circuit pattern comprising openings 120. The transferred circuit pattern can include, but is not limited to, a pattern for one or more features. Examples of the one or more features include, but are not limited to, a via, a conductive line, a structure, an interconnect (e.g., a wire, a bump, any other type of bump, a conductive pillar, etc.), an electronic component (e.g., an inductor, a capacitor, a resistor, a transistor, etc.), or any combination thereof. FIG. 1H, which is described below, includes additional details on an embodiment of some features formed using the transferred circuit pattern. For one embodiment, the removal technique can be any suitable removal technique known in the art. For example, the removal technique can include chemical etching techniques, mechanical etching techniques, etc.

Referring now to FIG. 1H, vias 122A-B and conductive lines 124A-B may be formed in the circuit pattern comprising openings 120 of the patterned resist layer 114. The specific embodiment shown in FIG. 1G includes: (i) one or more vias 122A-B formed on pads 106A-B formed on the seed layer 112; and (ii) one or more conductive lines 124A-B formed on the seed layer 112. The vias 122A-B may be conductive vias. For some embodiments, forming vias 122A-B and conductive lines 124A-B may include depositing, applying, plating, or growing one or more metal layers in the openings 120. For one embodiment, forming vias 122A-B and conductive lines 124A-B comprises performing an electrolytic metal plating operation to plate one or more metal layers (e.g., Cu, etc.) on or onto the top surfaces of the seed layer 112 that are not covered by the resist layer 114. In this way, the openings 120 are filled (at least partially) with one or more metal layers to form vias 122A-B and conductive lines 124A-B.

For one embodiment, forming the vias 122A-B includes forming a structure. For example, the via 122A may be formed as a via-trace structure. For another example, the via 122B may be formed as a via-trace structure. Exemplary illustrations of structures are described below in connection with at least one of FIGS. 2A-2E.

With regard again to FIG. 1H, the vias 122A-B and the conductive lines 124A-B are each separated by at least one portion of the unexposed resist layer 114. Top surfaces of the vias 122A-B and/or conductive lines 124A-B may or may not be co-planar with top surfaces of the unexposed portions of the resist layer 114. For one embodiment, the vias 122A-B and conductive lines 124A-B have z-heights that are lower than z-heights of the unexposed portions of the resist layer 114. In this way, top surfaces of the vias 122A-B and conductive lines 124A-B are not co-planar with top surfaces of the unexposed portions of the resist layer 114. The one or more metal layers used to form vias 122A-B and conductive lines 124A-B can be deposited via any suitable deposition technique, e.g., a plating technique, any suitable technique of depositing metal layers, any combination of suitable techniques, etc. The one or more metal layers used to form vias 122A-B and conductive lines 124A-B can be formed from Cu, any suitable metal (e.g., a conductive metal, etc.), any suitable metal alloy (e.g., a conductive metal, etc.), or any combination of suitable metals or metal alloys. For one embodiment, a length of an alignment between a via selected from the vias 122A-B and a pocket selected from the pockets 110A-B ranges from 5 μm to 7.5 μm. For one embodiment, at least one of the vias 112A-B has a diameter that ranges from 5 μm to 8 μm. For one embodiment, a minimum length from an edge of a via selected from the vias 122A-B to an edge of a conductive line selected from the conductive lines 124A-B is less than or equal to 13.5 μm. For one embodiment, a pitch between two of the vias 122A-B is less than or equal to 100 μm. For one embodiment, a width of a conductive line selected from the conductive lines 124A-B is less than or equal to 8 μm. For one embodiment, a pitch between the two conductive lines 124A-B is less than or equal to 10 μm.

With regard now to FIG. 1I, the patterned resist layer 114 may be removed to uncover or reveal one or more portions of the seed layer 112. For one embodiment, none of the vias 122A-B and conductive lines 124A-B are on the uncovered portion(s) of the seed layer 112. This removal operation is performed subsequent to formation of the vias 122A-B and conductive lines 124A-B. The patterned resist layer 114 may be removed or stripped by conventional techniques, such as by use of one or more resist stripping techniques known in the art, any other suitable technique used for removing resist layers known in the art, or any combination of suitable techniques used for removing resist layers known in the art. As used herein, "an uncovered portion of a layer" and its variations mean that a top surface of the uncovered portion is revealed because no component or layer is on the uncovered portion. As used herein, "a covered portion of a layer" and its variations mean that a top surface of the covered portion is not revealed because one or more components or layers are on the uncovered portion. Side surfaces of a covered portion of a layer may or may not be covered by any component, layer, feature, or material.

Referring now to FIG. 1J, the uncovered top portion(s) of the seed layer 112 may be removed to uncover or reveal one or more top portions of the dielectric layer 108. Additionally, the blank panel 102 may be removed or etched away to reveal or expose a bottom surface of the metal layer 104. Furthermore, the metal layer 104 may be removed to reveal uncovered bottom surfaces of the dielectric layer 108 and the pads 106A-B. Any suitable removal or etching technique may be used.

For one embodiment, no portion of the seed layer 112 is on the uncovered top portion(s) of the dielectric layer 108. This removal operation is performed subsequent to removal of the patterned resist layer 114. The uncovered portion(s) of the seed layer 112 may be removed by conventional techniques, such as by use of one or more etching techniques known in the art, any other suitable technique used for removing seed layers known in the art, or any combination of suitable techniques used for removing seed layers known in the art.

After the operations described in connection with FIG. 1J are performed, a package substrate 198 is formed. As shown in FIG. 1J, the package substrate 198 comprises pads 106A-B, vias 122A-B on the pads 106A-B, and conductive lines 124A-B adjacently located next to the vias 122A-B. The package substrate 198 may be subjected additional operations/processes (not shown in FIGS. 1A-1J) in order to fabricate a semiconductor package. One or more of these additional operations/processes are described below in connection with at least FIGS. 1K-1N. For one embodiment, a semiconductor package (e.g., the semiconductor package 199 described below in connection with FIG. 1N, etc.) may comprise one or more package substrates 198. The package substrate 198 provides several advantages. One advantage of the package substrate 198 is that, in a larger package substrate comprised of the package substrate 198 and multiple layers, a pad is not required for each layer in the larger package substrate. In this way, the achievable IO/mm/layer of the larger package substrate can be increased, the number of layers in the larger package substrate can be reduced, and/or the sizes of the features in or on the larger package substrate can be reduced. One more advantage is that the package substrate 198 can assist with reducing or eliminating misalignment between two or more of the pads 106A-B, the vias 122A-B on the pads 106A-B, and the conductive lines 124A-B adjacently located next to the vias 122A-B, which can in turn assist with reducing one or more sizes of the pads 106A-B, the vias 122A-B on the pads 106A-B, and the conductive lines 124A-B adjacently located next to the vias 122A-B. Reducing one or more sizes of the pads 106A-B, the vias 122A-B on the pads 106A-B, and the conductive lines 124A-B adjacently located next to the vias 122A-B can assist with increasing the achievable IO/mm/layer of the package substrate 198. Another advantage of the package substrate 198 is that one or more pitches between two or more of the conductive lines 124A-B, the vias 122A-B, and pads 106A-B can be reduced (when compared to a conventional package substrate that is not formed in accordance with the method described above in connection with FIGS. 1A-1J). This reduction in the pitch(es) can assist with increasing the achievable IO/mm/layer of the package substrate 198. Yet another advantage is that the package substrate 198 can assist with providing flexibility towards the choice of materials used for fabricating the package substrate 198. One more advantage is that no investment in specialized equipment or materials is required to perform one or more of the techniques described herein—that is, currently available equipment or materials known in the art of semiconductor manufacturing and/or packaging can be used to form or fabricate the package substrate 198.

For one or more embodiments, the Litho-VIP method described above in connection with FIGS. 1A-1J can be used to fabricate a package substrate 198 that can assist with improving IO density from 40 IO/mm/layer to 50 IO/mm/layer. This improvement is approximately a twenty percent (20%) improvement over a conventional package substrate that is not formed in accordance with the Litho-VIP method described herein in connection with FIGS. 1A-1J.

Moving on to FIG. 1K, one or more additional layers 126 (e.g., at least one metal layer, at least one dielectric layer, at least one other layer known in the art, any combination thereof, etc.) may be deposited, formed, or applied above, on, or onto the vias 122A-B, the conductive lines 124A-B, covered portions of the seed layer 112, and uncovered portions of the first dielectric layer 108. For example, the additional layer(s) 126 may comprise one or more metal layers sandwiched between one or more dielectric layers. For one embodiment, and as shown in FIG. 1K, the additional layer(s) 126 encapsulate the vias 122A-B, the conductive lines 124A-B, covered portions of the seed layer 112, and uncovered portions of the first dielectric layer 108. As used herein, "encapsulating" does not require all surfaces to be encased within the additional layer(s) 126. For some embodiments, the amount of the additional layer(s) 126 is controlled to achieve a specified z-height. Furthermore, top surfaces or sides of one or more the vias 122A-B and conductive lines 124A-B may or may not be co-planar with top surfaces or sides of the additional layer(s) 126. For the embodiment shown in FIG. 1K, top surfaces or sides of the vias 122A-B and conductive lines 124A-B are not co-planar with top surfaces or sides of the additional layer(s) 126. Other embodiments, however, are not so limited. For example, top surfaces or sides of one or more of the vias 122A-B and conductive lines 124A-B are co-planar with top surfaces or sides of the additional layer(s) 126. For one or more embodiments, the additional layer(s) 126 do not encapsulate the vias 122A-B, the conductive lines 124A-B, covered portions of the seed layer 112, and uncovered portions of the first dielectric layer 108.

For one embodiment, the additional layer(s) 126 include one or more metals layers that may be deposited, formed, or applied on or onto the vias 122A-B, the conductive lines 124A-B, covered portions of the seed layer 112, and uncovered portions of the first dielectric layer 108. For one embodiment, the one or more metal layers are applied via sputtering, electroplating, depositing, any other suitable technique, or any combination of suitable techniques. The one or more metal layers may comprise Cu, any other suitable metallic material or metal alloy, or any combination of suitable metallic materials or metal alloys. For one embodiment, the one or more metal layers include an adhesion layer. For one embodiment, a metal layer is formed by printing sinterable bonding material onto the one or more other layers of the additional layers 126. The sinterable bonding material can be formed from copper, silver, a copper-silver alloy, or any other suitable metal or metal alloy. For yet another embodiment, the metal layer is formed by laminating a metal or metal alloy (e.g., copper, etc.) onto the one or more other layers of the additional layers 126.

With regard again to FIG. 1M, for one or more embodiments, the additional layer(s) 126 include one or more features for warpage control (e.g., stiffener, a foil, any other suitable features for warpage control, any combination thereof, etc.). The one or more features for warpage control may be electroplated or deposited on or onto the one or more other layers of the additional layers 126. For one or more other embodiments, the additional layer(s) 126 include one or more foils (e.g., a copper foil, a black oxide treated copper foil, a foil formed from a suitable metal or metal alloy, a foil formed from a suitable combination of metals, a foil formed from a suitable combination of metal alloys, any combination thereof, etc.). For these embodiments, the one or more foils may be attached with an adhesive on or onto the one or more other layers of the additional layers 126 to provide warpage control.

The additional layer(s) 126 may be deposited, applied, formed using any suitable technique or combination of techniques known in the art (e.g., techniques as described above in connection with FIGS. 1A-1K, etc.). Furthermore, the additional layer(s) 126 may include one or more features or components therein or thereon (e.g., semiconductor dies, pads, vias, conductive lines, electronic components (e.g., inductors, capacitors, etc.), etc.). Any suitable technique or combination of techniques known in the art may be used to deposit, apply, or form the one or more features or components in, on, or onto the additional layer(s).

With regard now to FIG. 1L, a solder resist composition 128 may be deposited, applied, or formed on or onto a bottom side of the metal layer 104. Any suitable technique or combination of techniques known in the art may be used to deposit, apply, or form the solder resist composition 128 on or onto the bottom side of the metal layer 104. For example, a lamination technique, a printing technique, etc.

Moving on to FIG. 1M, the solder resist composition 128 may be opened using one or more suitable techniques to create solder resist openings (SROs) 130. For one embodiment, the SROs 130 created by removing one or more portions of the solder resist composition 128 to reveal bottom surfaces of the pads 106A-B, where the bottom surfaces are partially or completely uncovered. Techniques used to create the SROs 130 include laser drilling, laser ablation, etching, chemical stripping, lithography, any other suitable technique, or any combination of suitable techniques known in the art.

With regard now to FIG. 1N, a semiconductor package 199 is formed after formation of the additional layer(s) 126, the pads 106A-B are cleaned (e.g., via desmearing techniques, any other suitable technique, etc.), and interconnects 136 (e.g., bumps, pillars, etc.) formed from appropriate materials (e.g., a metallic material, a combination of metallic materials, a solder material, a combination of solder materials, Sn57Bi, any other suitable material known in the art, etc.) are attached and reflowed.

Although not shown in FIGS. 1A-1N, the method used to form the semiconductor package 199 may, in some embodiments, include forming or disposing one or more additional features that are adjacent to, above, or under one or more of the vias 122A-B and conductive 124A-B. The additional features(s) may include, but are not limited to, interconnects (e.g., pillars formed from metal, metal alloys, and/or any other suitable conductive material, etc.), a system-on-a-chip (SoC), a central processing unit (CPU), a platform controller hub (PCH), a power management integrated circuit (PMIC), a semiconductor die, etc. Furthermore, for some embodiments, the additional layer(s) 126 may include one or more features that assist with propagating signals within the semiconductor package 199 (e.g., vias, pads, traces, redistribution layers, interconnects, etc.).

Figure 2A:
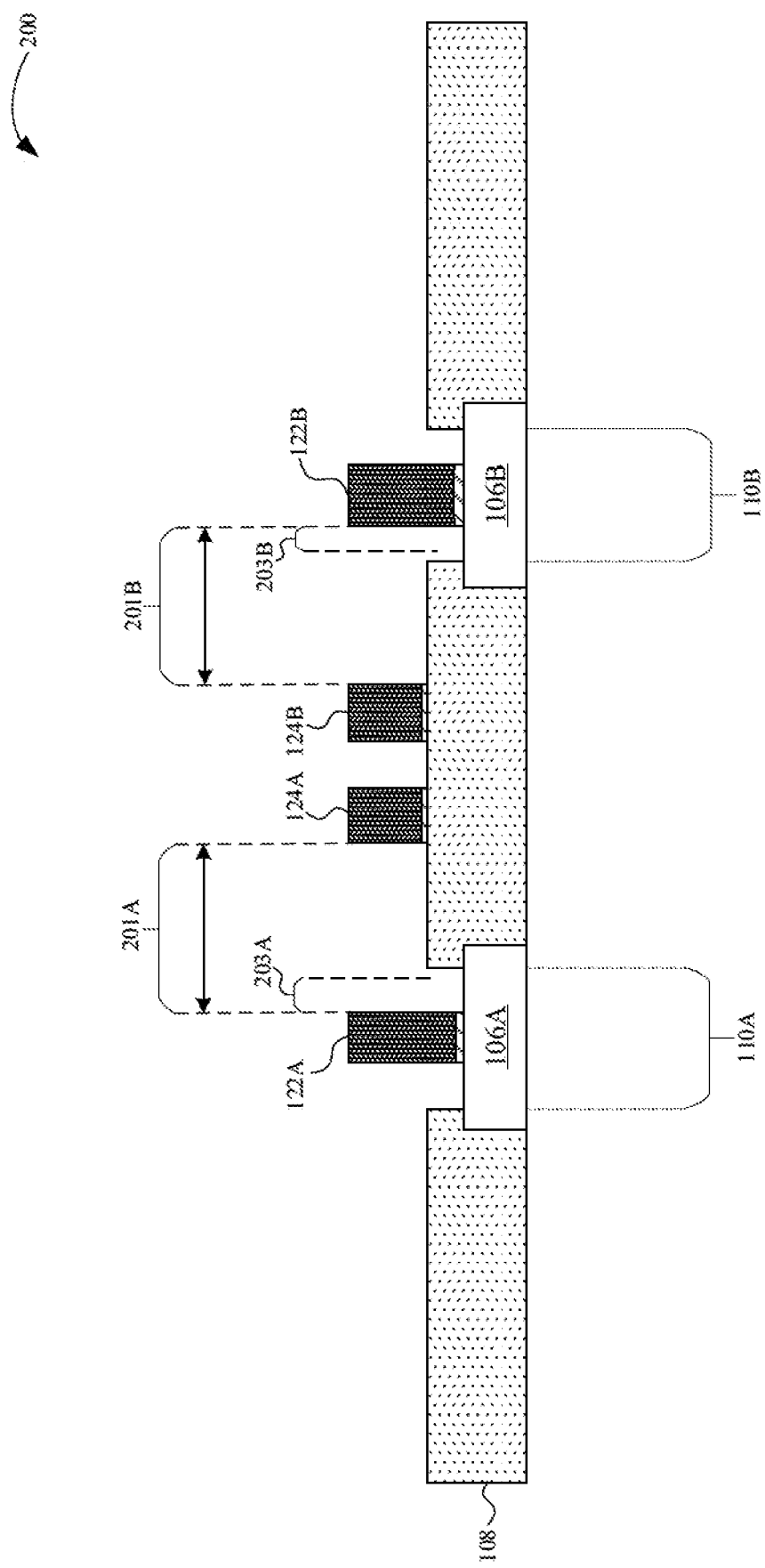
FIG. 2A illustrates a cross-sectional side view illustration of a package substrate formed using the method illustrated in FIGS. 1A-1N, according to one embodiment.

Referring now to FIG. 2A, which illustrates a cross-sectional side view illustration of a package substrate 200 formed using the Litho-VIP method described above in connection with FIGS. 1A-1N, according to one embodiment. The package substrate 200 is similar to or the same as the package substrate 198 described above in connection with FIGS. 1A-1K. The package substrate 200 can be a coreless package substrate or a cored package substrate. For one embodiment, the package substrate 200 is a coreless package substrate. The package substrate 200 can be included in a semiconductor package (e.g., the semiconductor package 199 described above in connection with at least FIG. 1N, a coreless semiconductor package, a cored semiconductor package, any other type of semiconductor package, etc.). For one embodiment, the package substrate 200 is in a coreless semiconductor package.

The package substrate 200 includes one or more features with reference numerals that are similar to or the same as one or more corresponding features with reference numerals shown in package substrate 198 and described above in connection with FIGS. 1A-1K. It is assumed that those having ordinary skill in the art can apply, vary, or modify the Litho-VIP method described above in connection with FIGS. 1A-1N to form the package substrate 200 without undue experimentation. The package substrate 200 focuses on the pockets 110A-B, the vias 122A-B, the conductive lines 124A-B, and the pads 106A-B.

For one embodiment, the Litho-VIP method includes: (i) formation of a clearance area 201A between the via 122A in the pocket 110A and conductive line 124A that is closest to the via 122A; and (ii) formation of a clearance area 201B between the via 122B in the pocket 110B and the conductive line 124B that is closest to the via 122B. For one embodiment, at least one of the clearance areas 201A-B includes a pitch between a respective one of the vias 122A-B and a respective one of the conductive lines 124A-B. For one embodiment, a pitch of at least one of the clearance areas 201A-B is a number. For example, a pitch of at least one of the clearance areas 201A-B is a number that ranges from 15 µm to 25 µm. One or more of the clearance areas 201A-B can assist with preventing the conductive lines 124A-B from being formed in the pockets 110A-B, which can in turn preventing short circuits in the package substrate 198. Also, one or more of the clearance areas 201A-B can assist with preventing the conductive lines 124A-B and the vias 122A-B from being plated over each other or from being over-plated, which can in turn assist with preventing short circuits in the package substrate 198.

For one embodiment, a pitch of at least one of the clearance areas 201A-B is a product of two and an expected overlay error (EOE)—that is, 2×EOE=a pitch of the clearance area 201A or a pitch of the clearance area 201B. Examples of an expected overlay error are shown in FIG. 2A as EOE 203A and EOE 203B. As shown in FIG. 2A, the EOE 203A is calculated as a pitch from an edge of the via 122A to an edge of the pocket 110A that is closest to the edge of the via 122A. Consequently, and for this example, a pitch of the clearance area 201A is equal to a product of two and the EOE 203A. Also, and as shown in FIG. 2A, the EOE 203B is calculated as a pitch from an edge of the via 122B to an edge of the pocket 110B that is closest to the edge of the via 122B. Consequently, and for this example, a pitch of the clearance area 201B is equal to a product of two and the EOE 203B.

Figure 2B:
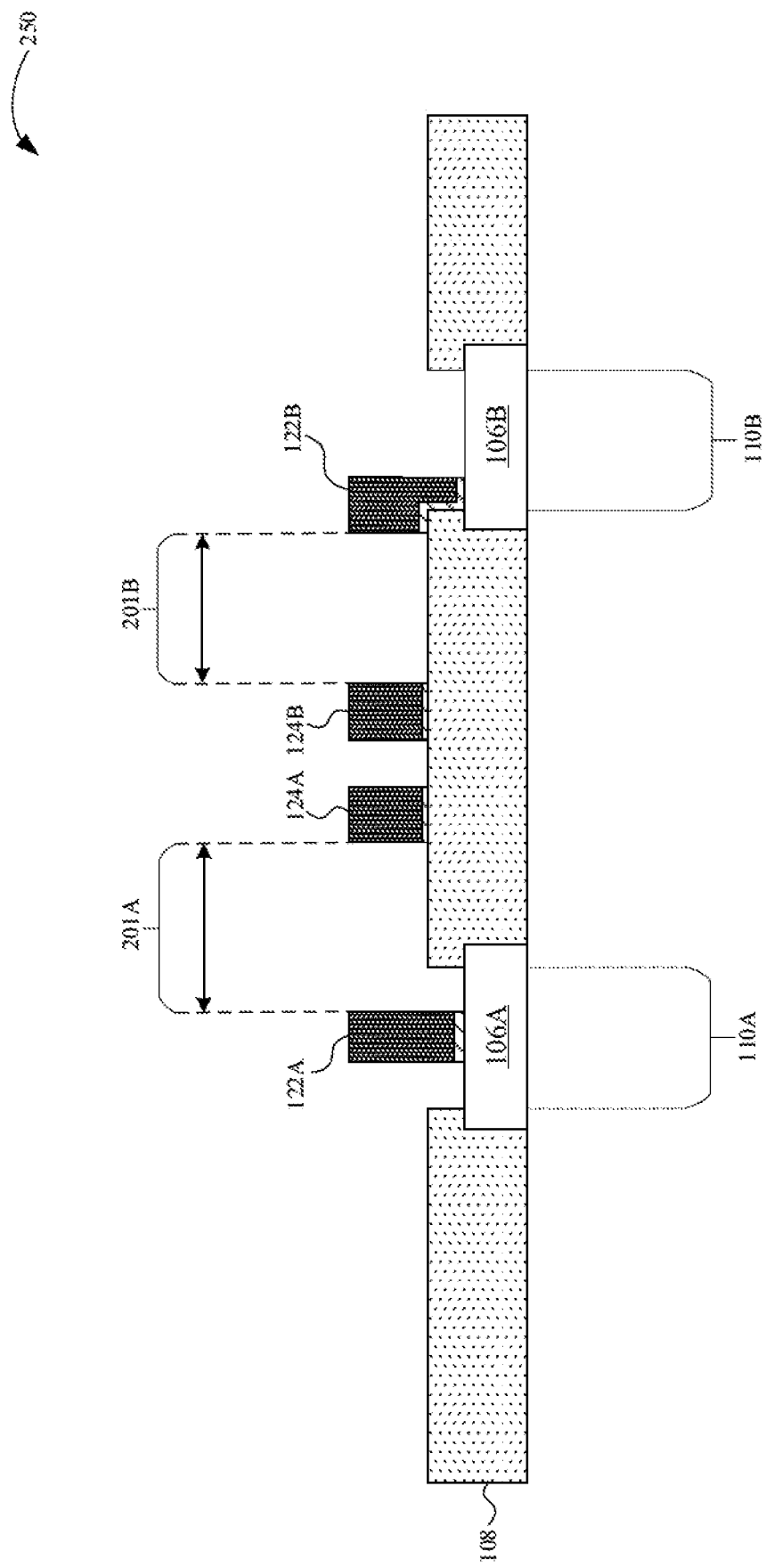
FIG. 2B illustrates a cross-sectional side view illustration of a package substrate formed using the method illustrated in FIGS. 1A-1N, according to another embodiment.

Referring now to FIG. 2B, which illustrates a cross-sectional side view illustration of a package substrate 250 formed using the Litho-VIP method described above in connection with FIGS. 1A-1N, according to another embodiment. The package substrate 250 can be a coreless package substrate or a cored package substrate. For one embodiment, the package substrate 250 is a coreless package substrate. The package substrate 250 can be included in a semiconductor package (e.g., the semiconductor package 199 described above in connection with at least FIG. 1N, a coreless semiconductor package, a cored semiconductor package, any other type of semiconductor package, etc.). For one embodiment, the package substrate 250 is in a coreless semiconductor package.

The package substrate 250 is similar to the package substrate 198 described above in connection with FIGS. 1A-1K, but the package substrate 250 includes some differences from the package substrate 198. For brevity, only the differences between the package substrate 250 and the package substrate 198 are described below in connection with FIG. 2B. Also, the package substrate 250 includes one or more features with reference numerals that are similar to or the same as one or more corresponding features with reference numerals shown in package substrate 198 and described above in connection with FIGS. 1A-1K. The package substrate 250 focuses on the pockets 110A-B, the vias 122A-B, the conductive lines 124A-B, and the pads 106A-B. It is assumed that those having ordinary skill in the art can apply, vary, or modify the Litho-VIP method described above in connection with FIGS. 1A-1N to form the package substrate 250 without undue experimentation.

For one embodiment of the Litho-VIP method, a portion of a via selected from the vias 122A-B can be formed outside its respective pocket 110A-B, so long as its respective clearance area (e.g., area 201A, area 201B, etc.) is maintained. For example, and as shown in FIG. 2B, a first portion of the via 122B may be formed outside the pocket 110B on the dielectric layer 108 and a second portion of the via 122B may be formed in the pocket 110B on the dielectric layer 108. For this example, the clearance area 201B includes a minimum pitch between the conductive line 124B and the via 122B. Clearance areas are described above in connection with FIG. 2A, so they are not described again in connection with FIG. 2B.

For one embodiment, at least one of the pads 106A-B shown in one or more of FIGS. 1-2B may have a size that ranges from 25 µm to 35 µm. For one embodiment, at least one of the pockets 110A-B shown in one or more of FIGS. 1-2B may have a size that ranges from 15 µm to 20 µm. The dielectric layer 108 shown in one or more of FIGS. 1-2B may have a thickness (e.g., z-height, etc.) that ranges from 5 µm to 8 µm. For one embodiment, a pitch of an alignment between a via selected from the vias 122A-B shown in one or more of FIGS. 1-2B and a pocket selected from the pockets 110A-B shown in one or more of FIGS. 1-2B ranges from 5 µm to 7.5 µm. For one embodiment, at least one of the vias 122A-B shown in one or more of FIGS. 1-2B has a size that ranges from 5 µm to 8 µm. For one embodiment, a pitch between an edge of a via selected from the vias 122A-B shown in one or more of FIGS. 1-2B to an edge of a conductive line selected from the conductive lines 124A-B shown in one or more of FIGS. 1-2B is less than or equal to 13.5 µm. For example, a pitch (e.g., a minimum pitch, etc.) between an edge of the via 122A to an edge of the conductive line 124A that is closest to the edge of the via 122A is less than or equal to 13.5 µm. For one embodiment, a pitch between two of the vias 122A-B shown in one or more of FIGS. 1-2B is less than or equal to 100 µm. For example, a pitch between the vias 122A-B (which are adjacent to each other with no other via between the vias 122A-B) is less than or equal to 100 µm. For one embodiment, a size of a conductive line selected from the conductive lines 124A-B shown in one or more of FIGS. 1-2B is less than or equal to 8 µm. For example, a width of a conductive line selected from the conductive lines 124A-B is less than or equal to 8 µm. For one embodiment, a pitch between the two conductive lines 124A-B shown in one or more of FIGS. 1-2B is less than or equal to 10 µm. For example, a pitch between the two conductive lines 124A-B (which are adjacent to each other with no other conductive line between the two conductive lines 124A-B) is less than or equal to 10 µm.

Figure 2C:
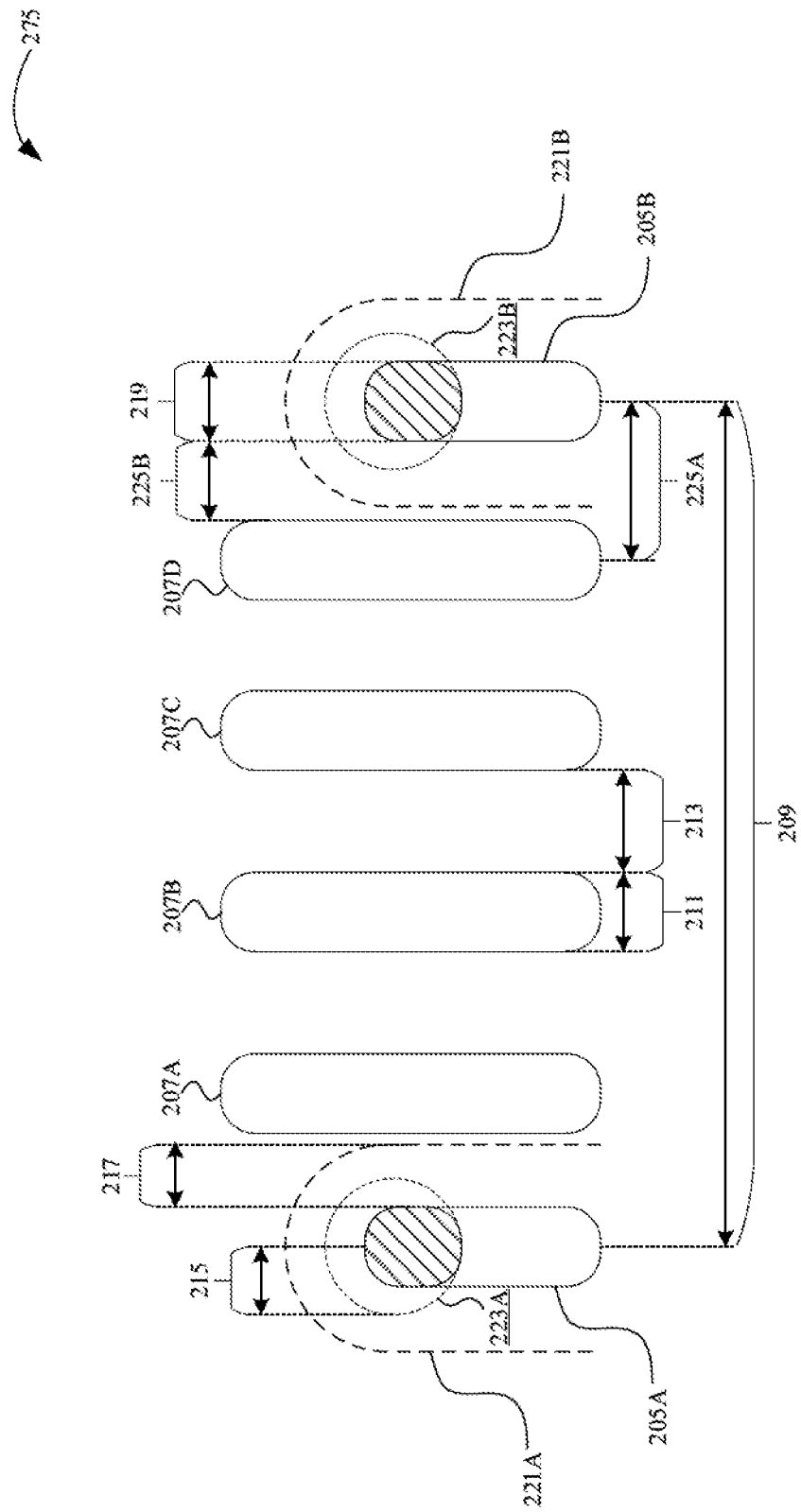
FIG. 2C illustrates a plan view of a package substrate comprising structures, conductive lines, pockets, and clearance areas in accordance with one embodiment. The structures, conductive lines, pockets, and clearance areas can be formed in accordance with one or more of the embodiments described above in connection with at least one of FIGS. 1-2B.

Moving on to FIG. 2C, which illustrates a plan view of a portion of a package substrate 275 comprising two structures 205A-B, four conductive lines 207A-D, two pockets 223A-B, and two clearance areas 221A-B. At least one of the structures 205A-B may be or comprise a via-trace structure. For example, each of the structures 205A-B is or comprises a via-trace structure.

The two structures 205A-B, four conductive lines 207A-D, two pockets 223A-B, and two clearance areas 221A-B can be formed in accordance with one or more of the embodiments described above in connection with one or more of FIGS. 1-2B. For example, at least one of the structures 205A-B is similar to or the same as at least one of the vias 122A-B described above in connection with one or more of FIGS. 1-2B. For another example, at least one of the conductive lines 207A-D is similar to or the same as at least one of the conductive lines 124A-B described above in connection with one or more of FIGS. 1-2B. For yet another example, at least one of the pockets 223A-B is similar to or the same as at least one of the pockets 110A-B described above in connection with one or more of FIGS. 1-2B. For one more example, at least one of the clearance areas 221A-B is similar to or the same as at least one of the clearance areas 201A-B described above in connection with one or more of FIGS. 2A-2B.

For one embodiment, a pitch 209 (e.g., a center-to-center spacing, an edge-to-edge spacing, etc.) between the structures 205A-B is provided. For one embodiment, the pitch 209 is a number. For a first example, the pitch 209 is less than or equal to 100 µm. For a second example, the pitch 209 is approximately equal to or equal to 100 µm.

For one embodiment, a size 219 of at least one of the via-trace structures 205A-B is provided. For one embodiment, the size 219 comprises a width. For one embodiment, the size 219 is a number. For a first example, the size 219 of the structure 205B is less than or equal to 8 µm. For a second example, the size 219 of the structure 205B is approximately equal to or equal to 8 µm.

For one embodiment, a pitch 213 (e.g., a center-to-center spacing, an edge-to-edge spacing, etc.) between two of the conductive lines 207A-D is provided. For one embodiment, the pitch 213 is between a structure (e.g., structure 205A, structure 205B, etc.) and one of the conductive lines 207A-D. For one embodiment, the pitch 213 is between a via and a structure (e.g., structure 205A, structure 205B, etc.). For one embodiment, the pitch 213 is a number. For a first example, the pitch 213 is less than or equal to 18 µm. For a second example, the pitch 209 is approximately equal to or equal to 18 µm.

For one embodiment, a size 211 of at least one of the conductive lines 207A-D is provided. For one embodiment, the size 211 comprises a width. The size 211 is applicable to any one of the conductive lines 207A-D. For one embodiment, the size 211 is a number. For a first example, the size 211 of the conductive line 207B is less than or equal to 8 µm. For a second example, the size 211 of the conductive line 207B is approximately equal to or equal to 8 µm.

Each of the pockets 223A-B are shown in FIG. 2C as circles, however, any shape may be used for the pockets 223A-B. For example, a square, any other polygon, any combination of polygons, a shape, any combination of shapes, etc. For one embodiment, a size 215 of at least one of the pockets is a number. For a first example, the size 215 comprises a radius of the pocket 223A that is less than or equal to 10 µm. For a second example, the size 215 comprises a radius of the pocket 223A that is approximately equal to or equal to 10 µm. For a third example, the size 215 comprises a width and/or a length of the pocket 223A, where one or more of the width and the length is less than or equal to 20 µm. For a fourth example, the size 215 comprises a width and/or a length of the pocket 223A, where one or more of the width and the length is approximately equal to or equal to 20 µm.

For one embodiment, at least one of the clearance areas 221A-B comprises a minimum pitch between: (i) a via or structure; and (ii) a clearance area that is closest to the via or structure. For example, and with regard to the clearance area 221A shown in FIG. 2C, a minimum pitch 217 is provided between: (i) an edge of the structure 205A; and (ii) an edge of the clearance area 221A that is closest to the edge of the structure 205A. In this way, the minimum pitch 217 can assist with preventing the conductive line 207A from being formed on the structure 205A and/or in the pocket 223A. For one embodiment, the minimum pitch 217 is a number. For a first example, the minimum pitch 217 is less than or equal to 14 µm. For a second example, the minimum pitch 217 is approximately equal to or equal to 14 µm. For a third example, the minimum pitch 217 is approximately equal to or equal to 13.5 µm.

For one embodiment, a minimum pitch (e.g., a center-to-center spacing, an edge-to-edge spacing, etc.) is provided between: (i) a via or structure; and (ii) a conductive line that is closest to the via or the structure. For example, and with regard to the structure 205B and the conductive line 207D shown in FIG. 2C, a minimum pitch 225A is provided between: (i) a center of the structure 205B; and (ii) a center of the conductive line 207D, where the conductive line 207D is the closest conductive line to the structure 205B. In this way, the minimum pitch 225A can assist with preventing the conductive line 207B from being formed on the structure 205B and/or in the pocket 223B. As shown in FIG. 2C, the minimum pitch 225A is a center-to-center spacing. For this example, the sizes of the structure 205B and the conductive line 207D are assumed to be known. For another example, and with regard to the structure 205B and the conductive line 207D shown in FIG. 2C, a minimum pitch 225B is provided. The minimum pitch 225B is between: (i) an edge of the structure 205B; and (ii) an edge of the conductive line 207D that is closest to the edge of the structure 205B, where the conductive line 207D is the closest conductive line to the structure 205B. In this way, the minimum pitch 225B can assist with preventing the conductive line 207B from being formed on the structure 205B and/or in the pocket 223B. For one embodiment, each of the minimum pitches 225A-B is a number. For a first example, at least one of the minimum pitches 225A-B is less than or equal to 22 µm. For a second example, at least one of the minimum pitches 225A-B is approximately equal to or equal to 22 µm. For a third example, at least one of the minimum pitches 225A-B is approximately equal to or equal to 21.5 µm.

Figure 2D:
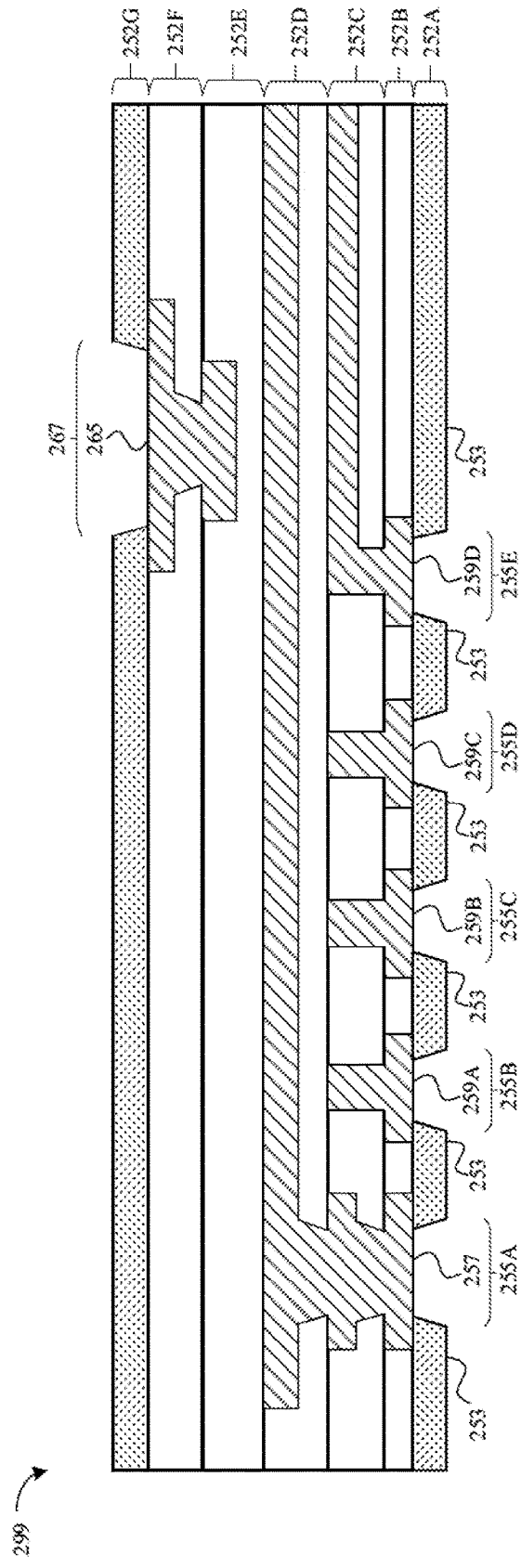
FIG. 2D illustrates a cross-sectional side view of a package substrate comprising multiple layers, where at least one of the multiple layers comprises a via, a pad, a conductive line, and/or a structure. The package substrate shown in FIG. 2D can be formed in accordance with one or more of the embodiments described above in connection with at least one of FIGS. 1-2C.

With regard now to FIG. 2D, which illustrates a cross-sectional side view of a package substrate 299 comprising multiple layers 252A-G. At least one of the layers 252A-G comprises one or more of structures 257, 259A-D, and 265. The package substrate 299 can be a coreless package substrate or a cored package substrate. For one embodiment, the package substrate 299 is a coreless package substrate. The package substrate 299 can be included in a semiconductor package (e.g., the semiconductor package 199 described above in connection with at least FIG. 1N, a coreless semiconductor package, a cored semiconductor package, any other type of semiconductor package, etc.). For one embodiment, the package substrate 299 is in a coreless semiconductor package.

The structure 257 comprises: (i) a pad in the layer 252B; (ii) a via in the layer 252C; (iii) a pad in the layer 252C; (iv) a via in the layer 252D; and (iv) a conductive line in or on the layer 252D. The via in the layer 252C is coupled to the pad in the layer 252B. The pad in the layer 252C is coupled to the via in the layer 252C. The via in the layer 252D is coupled to the pad in the layer 252C. The conductive line in or on the layer 252D is coupled the via in the layer 252D.

Figure 2E:
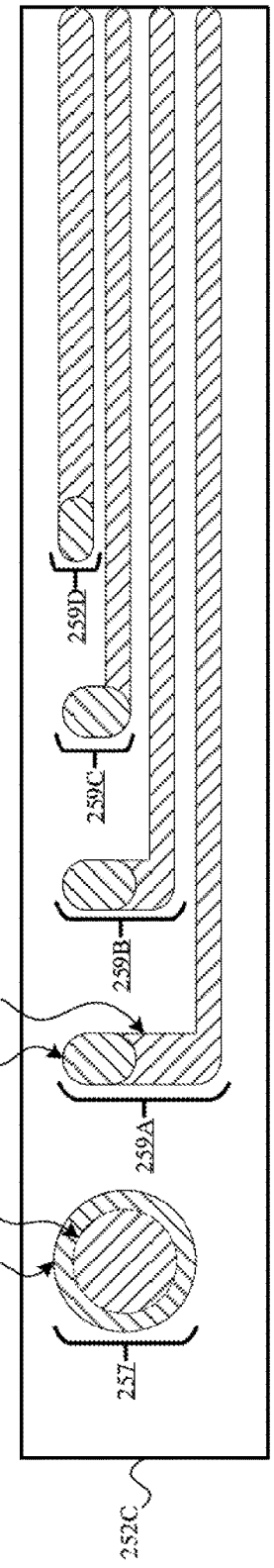
FIG. 2E illustrates a plan view of a layer of the package substrate shown in FIG. 2D.

Each of the structures 259A-D comprises a pad in the layer 252B, a via in the layer 252C, and a conductive line in or on the layer 252C. The conductive lines of each of the structures 259A-D are not shown in FIG. 2D, but are shown in FIG. 2E. For each of the structures 259A-D, a pad is coupled to a via and the via is coupled to a conductive line.

The structure 265 comprises: (i) a first pad in the layer 252E; (ii) a via in the layer 252F; and (iii) a second pad in the layer 252F. The first pad in the layer 252E is coupled to the via in the layer 252F. The second pad in the layer 252F is coupled to the via in the layer 252F.

At least one of the multiple layers 252A-G can be formed in accordance with one or more of the embodiments described above in connection with at least one of FIGS. 1-2C. At least one of the structures 257, 259A-D, and 265 can be formed in accordance with one or more of the embodiments described above in connection with at least one of FIGS. 1-2C. For one embodiment, the structure 257 is formed in accordance with conventional techniques (as opposed to the Litho-VIP method described above in connection with one or more of FIGS. 1-2C). For one embodiment, one or more of the structures 259A-D is formed in accordance with one or more embodiments of the Litho-VIP method described above in connection with one or more of FIGS. 1-2C.

One or more of the layers 252 A-G can be viewed as a routing layer. For a first example, each of the layers 252B-F is a routing layer. For a second example, at least one of the layers 252B-D can be viewed as a high-density routing layer (when compared to the other layers 252E-F, which include fewer features than each of the layers 252B-D).

Each of the layers 252A and 252G can be formed from a solder resist composition 253. The solder resist composition 253 can be formed any suitable material known in the art for forming solder resist compositions or any combination of suitable materials known in the art for forming solder resist compositions. Each of the layers 252B-F can be formed from a dielectric material (e.g., an ABF, any other suitable dielectric material or combination of suitable dielectric materials, etc.).

The layer 252G has an SRO 267 that reveals a bottom surface of the pad in the layer 252F. The layer 252A has five SROs 255A-E. The SRO 255A reveals a top surface of the pad of the structure 257 in layer 252B. The SRO 255B reveals a top surface of the pad of the structure 259A in layer 252B. The SRO 255C reveals a top surface of the pad of the structure 259B in layer 252B. The SRO 255D reveals a top surface of the pad of the structure 259C in layer 252B. The SRO 255E reveals a top surface of the pad of the structure 259D in layer 252B. Each of the SROs 255A-E and 265 can be formed using an appropriate removal technique or an appropriate combination of removal techniques (e.g., etching, laser drilling, etc.).

Moving on to FIG. 2E, which illustrates a plan view of a layer 252C of the package substrate 299 shown in FIG. 2D. The layer 252C is selected because it can be viewed as a high-density routing layer, as explained above in connection with FIG. 2D. As shown in FIG. 2E, a plan view of a portion of the structure 257 and a portion of each of the structures 259A-D is shown in or on the layer 252C. For brevity, the description provided below in connection with FIG. 2E focuses on the structure 257 and the structure 259A.

The structure 257 is formed using conventional techniques known in the art (as opposed to the Litho-VIP method described above in connection with at least FIGS. 1-2C), while the structure 259A is formed in accordance with one or more embodiments of the Litho-VIP method described above in connection with one or more of FIGS. 1-2C. This difference between the structures 257 and 259A results in one or more of the following: (i) No pad is on or above the via 273 of the structure 259A in the layer 252C, while the structure 257 in the layer 252C includes a pad 269 on a via 271; (ii) a size of the via 271 of the structure 257 that is in the layer 252C is larger than a size of the via 273 of the structure 259A that is in the layer 252C; (iii) a size of the pad 269 of the structure 257 that is in the layer 252C is larger than a size of the pad of the structure 259A that is in the layer 252B (not shown in FIG. 2E because the pad of the structure 259A is in the layer 252B as shown in FIG. 2D); and (iv) a size of the conductive line of the structure 257 (not shown in FIG. 2E because the conductive line of the structure 257 is in or on the layer 252D as shown in FIG. 2D) is equal to or larger than a corresponding size of the conductive line 275 of the structure 259A that is in or on the layer 252C.

One advantage attributable to the package substrate 299 is that a pad is not required for each layer in the package substrate 299. In this way, the achievable IO/mm/layer of the package substrate 299 can be increased, the number of layers in the package substrate 299 can be reduced, and/or the sizes of the features in or on the package substrate 299 can be reduced. Increasing the achievable IO/mm/layer of the package can assist with increasing communication bandwidth. For example, and as shown in one or more of FIGS. 2D and 2E, a pad is not needed in the layer 252C for each of the structures 259A-D formed in accordance with one or more embodiments of the Litho-VIP method described above in connection with one or more of FIGS. 1-2C. In contrast, and for this example, a pad is needed in the layer 252C for the structure 257 formed using conventional techniques known in the art (as opposed to the Litho-VIP method described above in connection with at least FIGS. 1-2C).

As described above in connection with one or more of FIGS. 1-2E, one or more embodiments of the Litho-VIP method described herein can assist with reducing sizes of conductive lines, vias, and pads. This reduction can in turn assist with optimizing a package substrate by reducing thicknesses (e.g., z-heights, etc.) of layers in the package substrate, with reducing the number of layers in the package substrate, and with increasing an achievable IO/mm/layer of the package substrate. Optimizing a package substrate based on one or more embodiments of the Litho-VIP method described herein can in turn assist with miniaturization of the optimized package substrate, which in turn can assist with miniaturization of an electronic device comprising the optimized package substrate. Also, optimizing a package substrate based on one or more embodiments of the Litho-VIP method described herein can in turn assist with optimizing a semiconductor package that includes the optimized package substrate by reducing thicknesses (e.g., z-heights, etc.) of layers in the semiconductor package, with reducing the number of layers in the semiconductor package, and with increasing an achievable IO/mm/layer of the semiconductor package. Optimizing a semiconductor package based on one or more embodiments of the Litho-VIP method described herein can in turn assist with miniaturization of the optimized semiconductor package, which in turn can assist with miniaturization of an electronic device comprising the optimized semiconductor package.

Figure 3:
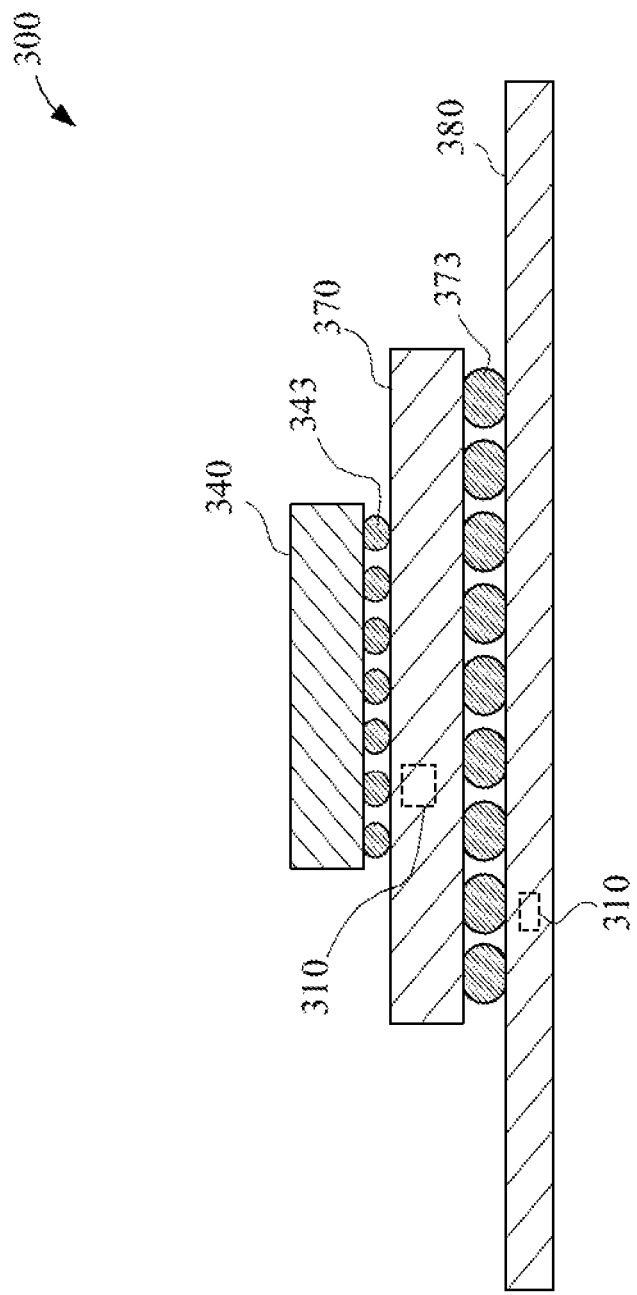
FIG. 3 illustrates a cross-sectional illustration of a packaged system, according to an embodiment.

Referring now to FIG. 3, a cross-sectional illustration of a packaged system 300 is shown, in accordance with an embodiment. For an embodiment, the packaged system 300 may include a semiconductor die 340 electrically coupled to a package substrate 370 with solder bumps 343. For additional embodiments, the semiconductor die 340 may be electrically coupled to the package substrate 370 with any suitable interconnect architecture, such as wire bonding or the like. The package substrate 370 may be electrically coupled to a board, such as a printed circuit board (PCB) 380, with solder bumps 373. For additional embodiments, the package substrate 370 may be electrically coupled to a board, such as the PCB 380, with any suitable interconnect architecture, such as wire bonding or the like.

For an embodiment, a feature 310 (e.g., a conductive line, a via, a pad, a structure, an inductor, a capacitor, a transistor, any other feature, etc.) formed based on one or more of the embodiments described above may be integrated into: (i) the package substrate 370; (ii) the board 380; or (iii) the package substrate 370 and the board 380. Embodiments include any number of features 310 formed into the package substrate 370 and/or the board 380. For example, a plurality of conductive lines, vias, pads, and/or structures 310 may be integrated—for communication or any other desired use—into: (i) the package substrate 370; (ii) the board 380; or (iii) the package substrate 370 and the board 380.

Figure 4:
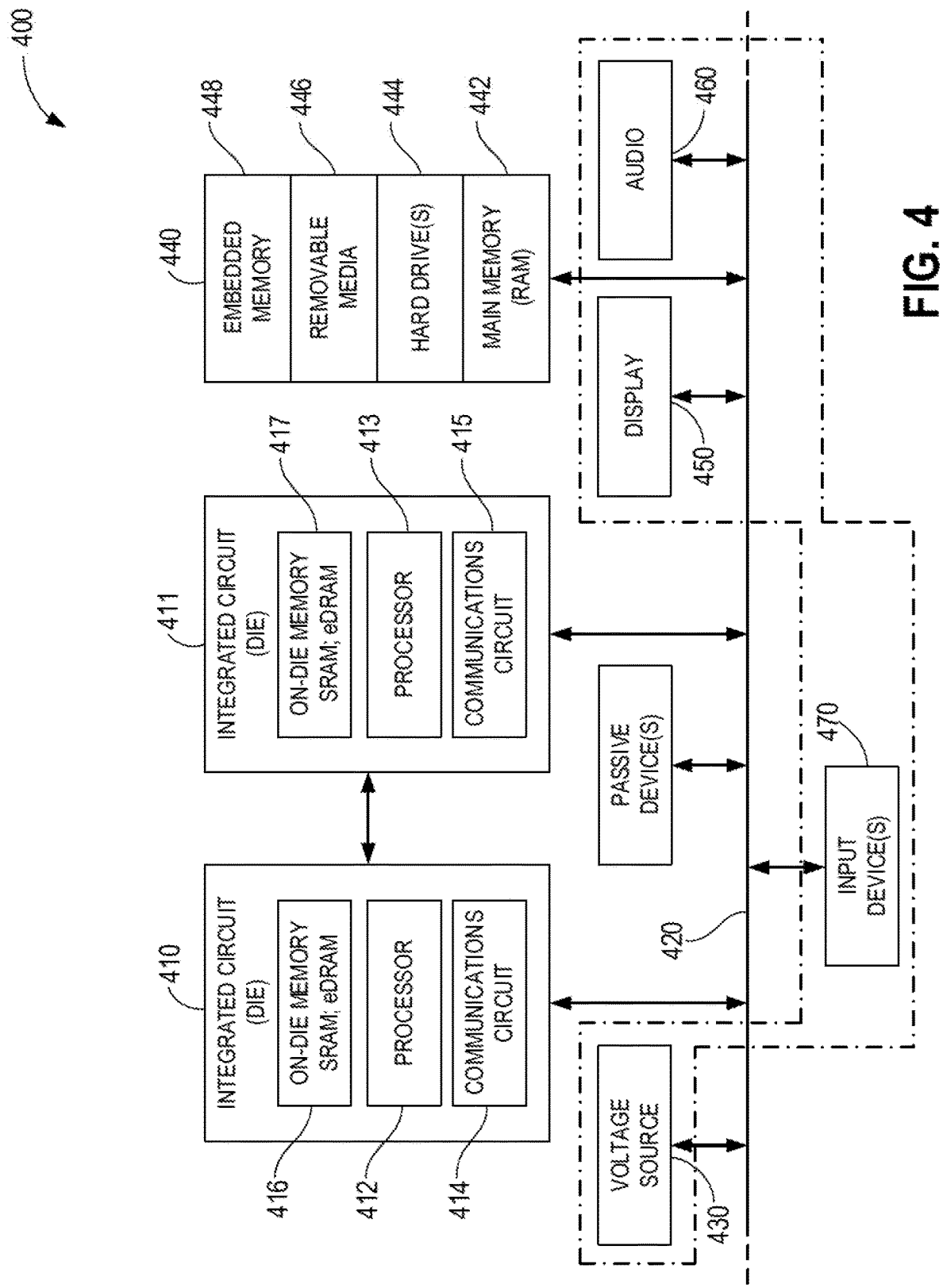
FIG. 4 is an illustration of a schematic block diagram of a computer system that utilizes a semiconductor package, according to an embodiment.

FIG. 4 illustrates a schematic of computer system 400 according to an embodiment. The computer system 400 (also referred to as an electronic system 400) can include a semiconductor package having a package substrate according to any of the embodiments and their equivalents as set forth in this disclosure. The computer system 400 may be a mobile device, a netbook computer, a wireless smart phone, a desktop computer, a hand-held reader, a server system, a supercomputer, or a high-performance computing system.

The system 400 can be a computer system that includes a system bus 420 to electrically couple the various components of the electronic system 400. The system bus 420 is a single bus or any combination of busses according to various embodiments. The electronic system 400 includes a voltage source 430 that provides power to the integrated circuit 410. For one embodiment, the voltage source 430 supplies current to the integrated circuit 410 through the system bus 420.

The integrated circuit 410 is electrically coupled to the system bus 420 and includes any circuit, or combination of circuits according to an embodiment. For an embodiment, the integrated circuit 410 includes a processor 412. As used herein, the processor 412 may mean any type of circuit such as, but not limited to, a microprocessor, a microcontroller, a graphics processor, a digital signal processor, or another processor. For an embodiment, the processor 412 includes, or is coupled with, a semiconductor package having a package substrate in accordance with any of the embodiments and their equivalents, as described in the foregoing specification. For an embodiment, SRAM embodiments are found in memory caches of the processor. Other types of circuits that can be included in the integrated circuit 410 are a custom circuit or an application-specific integrated circuit (ASIC), such as a communications circuit 414 for use in wireless devices such as cellular telephones, smart phones, pagers, portable computers, two-way radios, and similar electronic systems, or a communications circuit for servers. For an embodiment, the integrated circuit 410 includes on-die memory 416 such as static random-access memory (SRAM). For an embodiment, the integrated circuit 410 includes embedded on-die memory 416 such as embedded dynamic random-access memory (eDRAM). For one embodiment, the on-die memory 416 may be packaged with a process in accord with any of the embodiments and their equivalents, as described in the foregoing specification.

For an embodiment, the integrated circuit 410 is complemented with a subsequent integrated circuit 411. Useful embodiments include a dual processor 413 and a dual communications circuit 415 and dual on-die memory 417 such as SRAM. For an embodiment, the dual integrated circuit 410 includes embedded on-die memory 417 such as eDRAM.

For an embodiment, the electronic system 400 also includes an external memory 440 that in turn may include one or more memory elements suitable to the particular application. Examples of a memory element include, but are not limited to, a main memory 442 in the form of RAM, one or more hard drives 444, and one or more drives that handle removable media 446, such as diskettes, compact disks (CDs), digital variable disks (DVDs), flash memory drives, and other removable media known in the art. The external memory 440 may also be embedded memory 448 such as the first die in a die stack, according to an embodiment.

For an embodiment, the electronic system 400 also includes a display device 450 and an audio output 460. For an embodiment, the electronic system 400 includes an input device such as a controller 470 that may be a keyboard, mouse, trackball, game controller, microphone, voice recognition device, or any other input device that inputs information into the electronic system 400. For an embodiment, an input device 470 is a camera. For an embodiment, an input device 470 is a digital sound recorder. For an embodiment, an input device 470 is a camera and a digital sound recorder.

At least one of the integrated circuits 410 or 411 can be implemented in a number of different embodiments, including a semiconductor package having a package substrate as described herein, an electronic system, a computer system, one or more methods of fabricating an integrated circuit, and one or more methods of fabricating an electronic assembly that includes a semiconductor package having a package substrate, according to any disclosed embodiments set forth herein and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the semiconductor package having a package substrate in accordance with any of the disclosed embodiments as set forth herein and their art-recognized equivalents. A foundation substrate may be included, as represented by the dashed line of FIG. 4. Passive devices may also be included, as is also depicted in FIG. 4.

Reference throughout this specification to "one embodiment," "an embodiment," "another embodiment" and their variations means that a particular feature, configuration, or characteristic described in connection with the embodiment is included in at least one embodiment. Thus, the appearances of the phrase "for one embodiment," "for an embodiment," "for another embodiment," "in one embodiment," "in an embodiment," "in another embodiment," or their variations in various places throughout this specification are not necessarily referring to the same embodiment. Furthermore, the particular features, configurations, or characteristics may be combined in any suitable manner in one or more embodiments.

The terms "over," "to," "between," "onto," and "on" as used in the foregoing specification refer to a relative position of one layer with respect to other layers. One layer "over" or "on" another layer or bonded "to" or in "contact" with another layer may be directly in contact with the other layer or may have one or more intervening layers. One layer "between" layers may be directly in contact with the layers or may have one or more intervening layers.

The description provided above in connection with one or more embodiments as described herein that is included as part of a process of forming semiconductor packages may also be used for other types of IC packages and mixed logic-memory package stacks. In addition, the processing sequences may be compatible with both wafer level packages (WLP), and integration with surface mount substrates such as LGA, QFN, and ceramic substrates.

In the foregoing specification, abstract, and/or figures, numerous specific details are set forth, such as specific materials and processing operations, in order to provide a thorough understanding of embodiments described herein. It will, however, be evident that any of the embodiments described herein may be practiced without these specific details. In other instances, well-known features, such as the integrated circuitry of semi conductive dies, are not described in detail in order to not unnecessarily obscure embodiments described herein. Furthermore, it is to be understood that the various embodiments shown in the Figures and described in connection with the Figures are illustrative representations and are not necessarily drawn to scale. Thus, various modifications and/or changes may be made without departing form the broader spirit and scope of the embodiments described in connection with the foregoing specification, abstract, and/or Figures. The description provided above in connection with one or more embodiments as described herein that is included as part of a process of forming semiconductor packages may also be used for other types of IC packages and mixed logic-memory package stacks. In addition, the processing sequences may be compatible with both wafer level packages (WLP), and integration with surface mount substrates such as LGA, QFN, and ceramic substrates.

In the foregoing specification, abstract, and/or figures, numerous specific details are set forth, such as specific materials and processing operations, in order to provide a thorough understanding of embodiments described herein. It will, however, be evident that any of the embodiments described herein may be practiced without these specific details. In other instances, well-known features, such as the integrated circuitry of semi conductive dies, are not described in detail in order to not unnecessarily obscure embodiments described herein. Furthermore, it is to be understood that the various embodiments shown in the Figures and described in connection with the Figures are illustrative representations and are not necessarily drawn to scale. Thus, various modifications and/or changes may be made without departing form the broader spirit and scope of the embodiments described in connection with the foregoing specification, abstract, and/or Figures.

Embodiments described herein include a package substrate, comprising: a pad in a dielectric layer, wherein the dielectric layer includes a pocket above the pad; a via, wherein one or more portions of the via are formed in the pocket above the pad; and a conductive line.

Additional embodiments described herein include a package substrate, wherein no pad is formed above the via.

Additional embodiments described herein include a package substrate, wherein zero or more portions of the via are formed on the dielectric layer outside the pocket.

Additional embodiments described herein include a package substrate, wherein the conductive line is adjacent to the via.

Additional embodiments described herein include a package substrate, further comprising one or more additional layers above one or more of the dielectric layer, the via, the conductive line, and the pad in the pocket.

Additional embodiments described herein include a package substrate, wherein the one or more additional layers comprise one or more of: a metal layer; and a second dielectric layer.

Additional embodiments described herein include a package substrate wherein the one or more additional layers comprise a feature for warpage control.

Additional embodiments described herein include a package substrate, wherein the feature for warpage control comprises a stiffener.

Additional embodiments described herein include a package substrate, wherein the feature for warpage control comprises a foil.

Additional embodiments described herein include a package substrate, wherein the pad includes a clearance area in or around the pocket.

Additional embodiments described herein include a package substrate, wherein the clearance area comprises a minimum pitch between the via and the conductive line.

Additional embodiments described herein include a package substrate, wherein the via and the conductive line form a structure.

Additional embodiments described herein include a package substrate, further comprising a solder resist composition on bottom sides of the dielectric layer and the pad, the solder resist composition comprising an opening under the pad.

Additional embodiments described herein include a package substrate, further comprising an interconnect formed in the opening under the pad.

Additional embodiments described herein include a package substrate, wherein the package substrate is a coreless package substrate.

Embodiments described herein include a method of forming a package substrate, comprising: forming a pad in a dielectric layer; forming a pocket above the pad in the dielectric layer; forming a via, wherein one or more portions of the via are formed in the pocket above the pad; and forming a conductive line.

Additional embodiments described herein include a method, wherein no pad is formed above the via.

Additional embodiments described herein include a method, wherein forming the via comprises: forming zero or more portions of the via on the dielectric layer outside the pocket.

Additional embodiments described herein include a method, wherein forming the conductive line comprises: forming the conductive line adjacent to the via.

Additional embodiments described herein include a method, further comprising forming one or more additional layers above one or more of the dielectric layer, the via, the conductive line, and the pad in the pocket.

Additional embodiments described herein include a method, wherein forming the one or more additional layers comprises forming one or more of: a metal layer; and a second dielectric layer.

Additional embodiments described herein include a method, wherein forming the one or more additional layers comprises forming a feature for warpage control.

Additional embodiments described herein include a method, wherein forming the feature for warpage control comprises forming one or more of a stiffener and a foil.

Additional embodiments described herein include a method, wherein forming the pocket comprises forming a clearance area in or around the pocket.

Additional embodiments described herein include a method, wherein forming a clearance area in or around the pocket comprises forming a clearance area that includes a minimum pitch between the via and the conductive line.

Additional embodiments described herein include a method, wherein the via and the conductive line form a structure.

Additional embodiments described herein include a method, further comprising depositing a solder resist composition on bottom sides of the dielectric layer and the pad, the solder resist composition comprising an opening under the pad.

Additional embodiments described herein include a method, further comprising forming an interconnect in the opening under the pad.

Additional embodiments described herein include a method, wherein the package substrate is a coreless package substrate.

Embodiments described herein include a package substrate, comprising: a pad in a dielectric layer, wherein the dielectric layer includes a pocket above the pad; and a structure, wherein the structure comprises a via and conductive line, wherein one or more portions of the via are formed in the pocket above the pad, and wherein no pad is formed above the via.

Additional embodiments described herein include a package substrate, wherein a z-height of the dielectric layer is at least equal to 5 μm and at most equal to 8 μm.

Additional embodiments described herein include a package substrate, wherein the pocket has a diameter that is at least equal to 15 μm and at most equal to 20 μm.

Additional embodiments described herein include a package substrate, wherein a width of the structure is less than or equal to 8 μm.

Additional embodiments described herein include a package substrate, further comprising a solder resist composition on bottom sides of the dielectric layer and the pad, the solder resist composition comprising an opening under the pad.

Additional embodiments described herein include a package substrate, further comprising an interconnect formed in the opening under the pad.

Additional embodiments described herein include a package substrate, wherein the package substrate is a coreless package substrate.

Embodiments described herein include a method of forming a package substrate, comprising: forming a pad in a dielectric layer; forming a pocket above the pad in the dielectric layer; and forming a structure, wherein forming the structure comprises forming a via and a conductive line, wherein no pad is formed above the via, wherein one or more portions of the via are formed in the pocket above the pad, and wherein zero or more portions of the via are formed on the dielectric layer outside the pocket.

Additional embodiments described herein include a method, wherein forming the pocket comprises forming a clearance area in or around the pocket.

Additional embodiments described herein include a method, wherein forming a clearance area in or around the pocket comprises forming a clearance area that includes a minimum pitch between the via and the conductive line.

Additional embodiments described herein include a method, wherein the package substrate is a coreless package substrate.

Additional embodiments include one or more of the preceding embodiments, wherein the pad may have a diameter that ranges from 25 μm to 35 μm.

Additional embodiments include one or more of the preceding embodiments, wherein the pocket may have a diameter that ranges from 15 μm to 20 μm.

Additional embodiments include one or more of the preceding embodiments, wherein the dielectric layer may have a thickness (e.g., z-height, etc.) that ranges from 5 μm to 8 μm.

Additional embodiments include one or more of the preceding embodiments, wherein a pitch of an alignment between a first via and a pocket is less than or equal to 7.5 μm.

Additional embodiments include one or more of the preceding embodiments, wherein a first via has a width that is less than or equal to 8 μm.

Additional embodiments include one or more of the preceding embodiments, wherein a pitch from a first edge of a first via to a second edge of a first conductive line that is closest to the edge of the first via is less than or equal to 13.5 μm, wherein the first and second edges differ from each other.

Additional embodiments include one or more of the preceding embodiments, wherein a pitch between a first via and a second via that is adjacent to the first via is less than or equal to 100 μm.

Additional embodiments include one or more of the preceding embodiments, wherein at least four conductive lines are between a first via and a second via.

Additional embodiments include one or more of the preceding embodiments, wherein a width of a first conductive line is less than or equal to 8 μm.

Additional embodiments include one or more of the preceding embodiments, wherein a pitch between a first conductive line and a second conductive line that is adjacent to the first conductive line is less than or equal to 10 μm.

Additional embodiments include one or more of the preceding embodiments, wherein the first via is part of a structure.

Additional embodiments include one or more of the preceding embodiments, wherein the second via is part of a structure.

Additional embodiments include one or more of the preceding embodiments, wherein the first conductive line is part of a structure.

Additional embodiments include one or more of the preceding embodiments, wherein the second conductive line is part of a structure.

Embodiments described herein include a method of forming a semiconductor package, comprising: a package substrate, wherein the package substrate is formed according to one or more of the preceding embodiments described above.

Embodiments described herein include a method of forming a semiconductor package, comprising: a package substrate coupled to a board (e.g., a printed circuit board, etc.), wherein the package substrate is formed according to one or more of the preceding embodiments described above.

Embodiments described herein include a semiconductor package, comprising: a package substrate, wherein the package substrate is formed according to one or more of the preceding embodiments described above.

Embodiments described herein include a semiconductor package, comprising: a package substrate coupled to a board (e.g., a printed circuit board, etc.), wherein the package substrate is formed according to one or more of the preceding embodiments described above.

Embodiments described herein include a method of forming a semiconductor package coupled to a board (e.g., a printed circuit board, etc.), the semiconductor package comprising: a package substrate, wherein the package substrate is formed according to one or more of the preceding embodiments described above.

Embodiments described herein include a semiconductor package coupled to a board (e.g., a printed circuit board, etc.), the semiconductor package comprising: a package substrate, wherein the package substrate is formed according to one or more of the preceding embodiments described above.

Embodiments described herein include a method of forming a system, comprising: a package substrate, wherein the package substrate is formed according to one or more of the preceding embodiments described above.

Embodiments described herein include a method of forming a system, comprising: a package substrate coupled to a board (e.g., a printed circuit board, etc.), wherein the package substrate is formed according to one or more of the preceding embodiments described above.

Embodiments described herein include a method of forming a system, comprising: a semiconductor package, wherein the semiconductor package is formed according to one or more of the preceding embodiments described above.

Embodiments described herein include a method of forming a system, comprising: a semiconductor package coupled to a board (e.g., a printed circuit board, etc.), wherein the semiconductor package is formed according to one or more of the preceding embodiments described above.

Embodiments described herein include a method of forming a system, comprising: a semiconductor package, wherein the package comprises a package substrate and wherein the package substrate is formed according to one or more of the preceding embodiments described above.

Embodiments described herein include a method of forming a system, comprising: a semiconductor package coupled to a board (e.g., a printed circuit board, etc.), wherein the package comprises a package substrate and wherein the package substrate is formed according to one or more of the preceding embodiments described above.

Embodiments described herein include a method of forming a system, comprising: a semiconductor package, wherein the package comprises a package substrate coupled to a board (e.g., a printed circuit board, etc.) and wherein the package substrate is formed according to one or more of the preceding embodiments described above.

Embodiments described herein include a system, wherein the system is formed according to one or more of the preceding embodiments described above.

Additional embodiments include one or more of the preceding embodiments, wherein the package substrate is a coreless package substrate.

Additional embodiments include one or more of the preceding embodiments, wherein the semiconductor package is a coreless semiconductor package.

It is to be appreciated that one or more portions of any of the preceding embodiments may be combined with one or more other portions of any of the preceding embodiments.

In the description, drawings, and claims provided herein, the use of "at least one of A, B, and C", "at least one of A, B, or C", "one or more of A, B, or C", or "one or more of A, B, and C" is intended encompass: (i) A alone; (ii) B alone; (iii) C alone; (iv) A and B together; (v) A and C together; (vi) B and C together; or (vii) A, B, and C together. Furthermore, the use of "A, B, and/or C" is intended encompass: (i) A alone; (ii) B alone; (iii) C alone; (iv) A and B together; (v) A and C together; (vi) B and C together; or (vii) A, B, and C together. It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrases "A or B", "A and B", and "A and/or B" will be understood to include the possibilities of "A alone" or "B alone" or "A and B."

The terms used in the following claims should not be construed to limit any of the embodiments described in connection with the foregoing specification, abstract, and/or Figures to the specific embodiments set forth in the foregoing specification, abstract, Figures, and/or claims. Rather, the scope of the claims are to be construed in accordance with established doctrines of claim interpretation.

What is claimed is:

1. A package substrate, comprising:
    a pad in a dielectric layer, wherein the dielectric layer includes a pocket above the pad, wherein an entirety of a top surface of the dielectric layer is planar, and wherein the pad has a bottommost surface at a same level as a bottommost surface of the dielectric layer;
    a via, wherein one or more portions of the via are in the pocket above the pad such that the via is not in contact with the dielectric layer; and
    a conductive line on the top surface of the dielectric layer.

2. The package substrate of claim 1, wherein zero or more portions of the via are on the dielectric layer outside the pocket.

3. The package substrate of claim 1, wherein the conductive line is adjacent to the via.

4. The package substrate of claim 1, further comprising one or more additional layers above one or more of the dielectric layer, the via, the conductive line, and the pad in the pocket.

5. The package substrate of claim 4, wherein the one or more additional layers comprise one or more of: a metal layer; and a second dielectric layer.

6. The package substrate of claim 4, wherein the one or more additional layers comprise a feature for warpage control.

7. The package substrate of claim 6, wherein the feature for warpage control comprises one or more of a stiffener and a foil.

8. The package substrate of claim 1, wherein the pad includes a clearance area in or around the pocket.

9. The package substrate of claim 8, wherein the clearance area comprises a minimum pitch between the via and the conductive line.

10. A package substrate comprising:
 a pad in a dielectric layer, wherein the dielectric layer includes a pocket above the pad, wherein an entirety of a top surface of the dielectric layer is planar, and wherein the pad has a bottommost surface at a same level as a bottommost surface of the dielectric layer;
 a structure comprising a via and a conductive line, wherein one or more portions of the via are in the pocket above the pad such that the via is not in contact with the dielectric layer, and wherein the conductive line is on the top surface of the dielectric layer.

11. The package substrate of claim 10, wherein a z-height of the dielectric layer is less than or equal to 8 µm.

12. The package substrate of claim 10, wherein the pocket has a diameter that is less than or equal to 20 µm.

13. The package substrate of claim 10, wherein a width of the structure is less than or equal to 8 µm.

14. The package substrate of claim 10, further comprising a solder resist composition on bottom sides of the dielectric layer and the pad, the solder resist composition comprising an opening under the pad.

15. The package substrate of claim 14, further comprising an interconnect in the opening under the pad.

* * * * *